United States Patent
Khayim et al.

(10) Patent No.: US 7,139,450 B2
(45) Date of Patent: Nov. 21, 2006

(54) LASER TRANSMITTER DEVICE

(75) Inventors: Tattee Khayim, Kawasaki (JP); Masaki Tohyama, Yokohama (JP); Tomoaki Yamaguchi, Kitakyushu (JP); Hirokazu Nishimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 10/436,953

(22) Filed: May 13, 2003

(65) Prior Publication Data

US 2004/0013352 A1   Jan. 22, 2004

(30) Foreign Application Priority Data

May 16, 2002  (JP)  ............... 2002-141496

(51) Int. Cl.
G02B 6/28 (2006.01)
(52) U.S. Cl. .......................... 385/24; 372/32
(58) Field of Classification Search .................. 385/24
See application file for complete search history.

(56) References Cited

U.S. PATENT DOCUMENTS

| 5,901,163 | A | 5/1999 | Ershov | |
|---|---|---|---|---|
| 5,970,076 | A | 10/1999 | Hamada | |
| 6,120,190 | A | 9/2000 | Leard et al. | |
| 6,529,534 | B1 * | 3/2003 | Yasuda | 372/32 |
| 6,744,793 | B1 * | 6/2004 | Stoner et al. | 372/32 |
| 6,782,017 | B1 * | 8/2004 | Kai et al. | 372/29.02 |
| 2002/0075912 | A1 * | 6/2002 | Ito et al. | 372/32 |

FOREIGN PATENT DOCUMENTS

| JP | 07-15078 | 1/1995 |
|---|---|---|
| JP | 07-16069 | 2/1995 |
| JP | 2000-323784 | 11/2000 |
| JP | 2002-50785 | 2/2002 |
| WO | 02/31933 | 4/2002 |

* cited by examiner

*Primary Examiner*—Nikita Wells
*Assistant Examiner*—Phillip A. Johnston
(74) *Attorney, Agent, or Firm*—Hogan & Hartson LLP

(57) ABSTRACT

A laser transmitter device includes a laser light source, first and second optical elements, and first and second detection elements. The first optical element has a first optical characteristic with wavelength dependency, whose light transmissivity or reflectivity shows a monotone increase or decrease within a wavelength range over channels. The second optical element has a second optical characteristic with wavelength dependency, whose transmissivity or reflectivity changes in a cycle corresponding to intervals of the channels or two times the intervals. The first detection element detects an intensity of light emitted from the laser light source and coming via the first optical element, and generates a first electric signal reflecting the first optical characteristic. The second detection element detects an intensity of light emitted from the laser light source and coming via the second optical element, and generates a second electric signal reflecting the second optical characteristic.

13 Claims, 20 Drawing Sheets

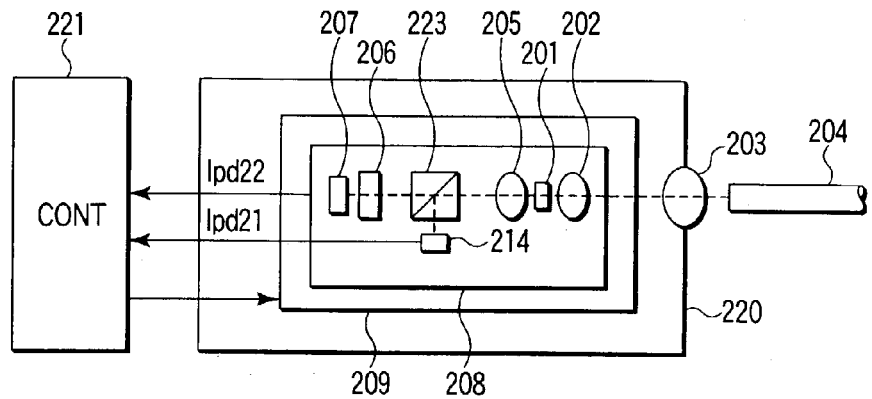
F I G. 9
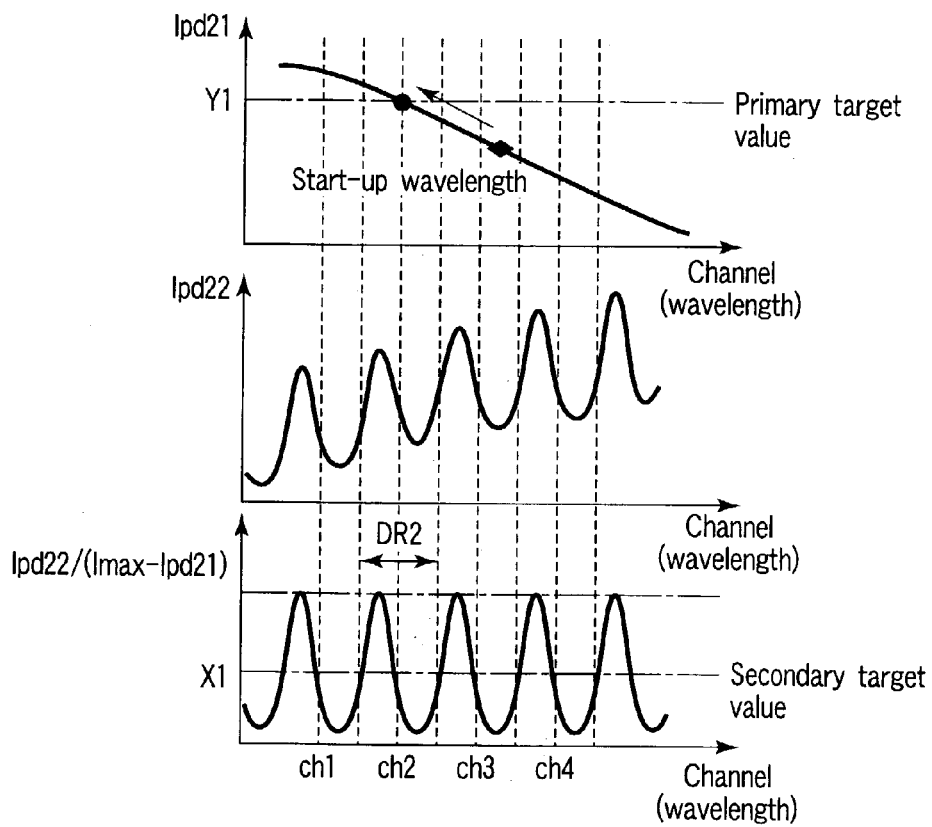
F I G. 10

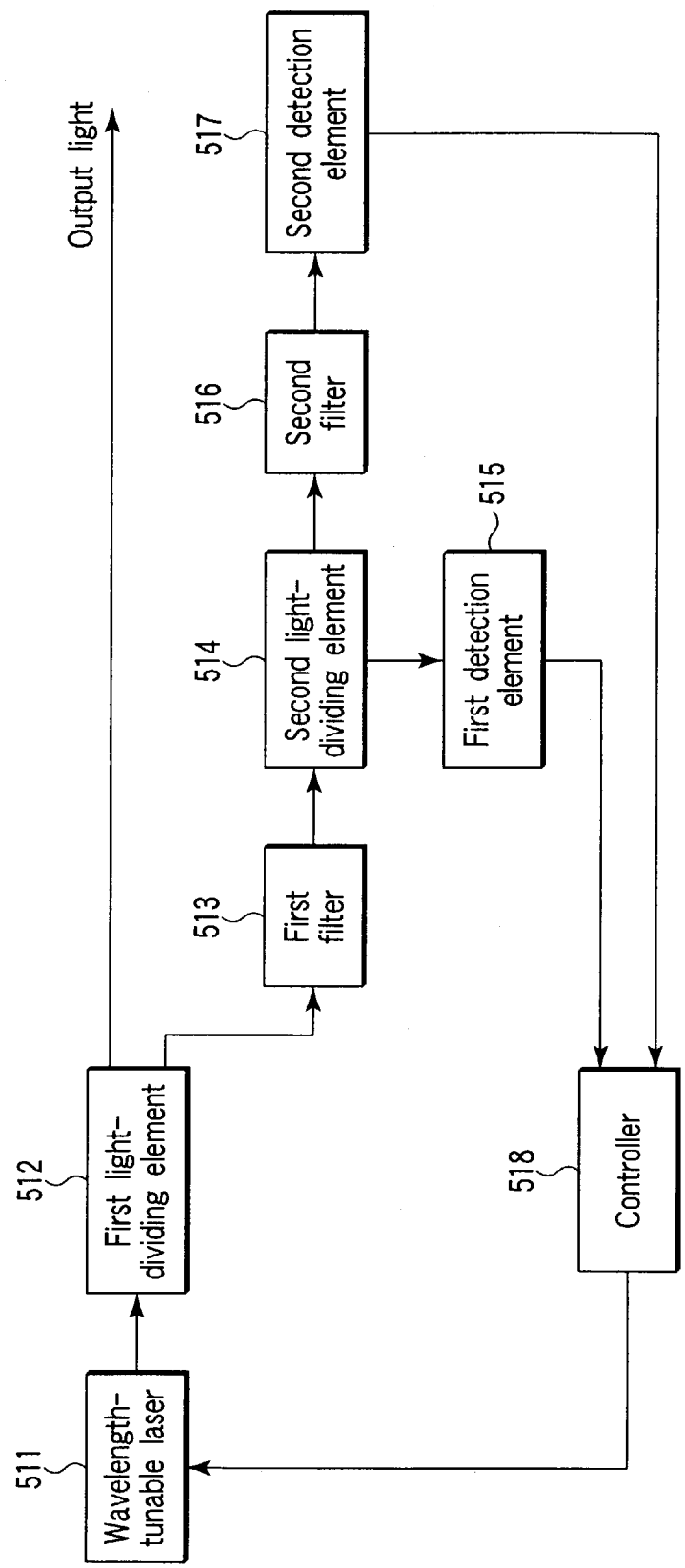
F I G. 22

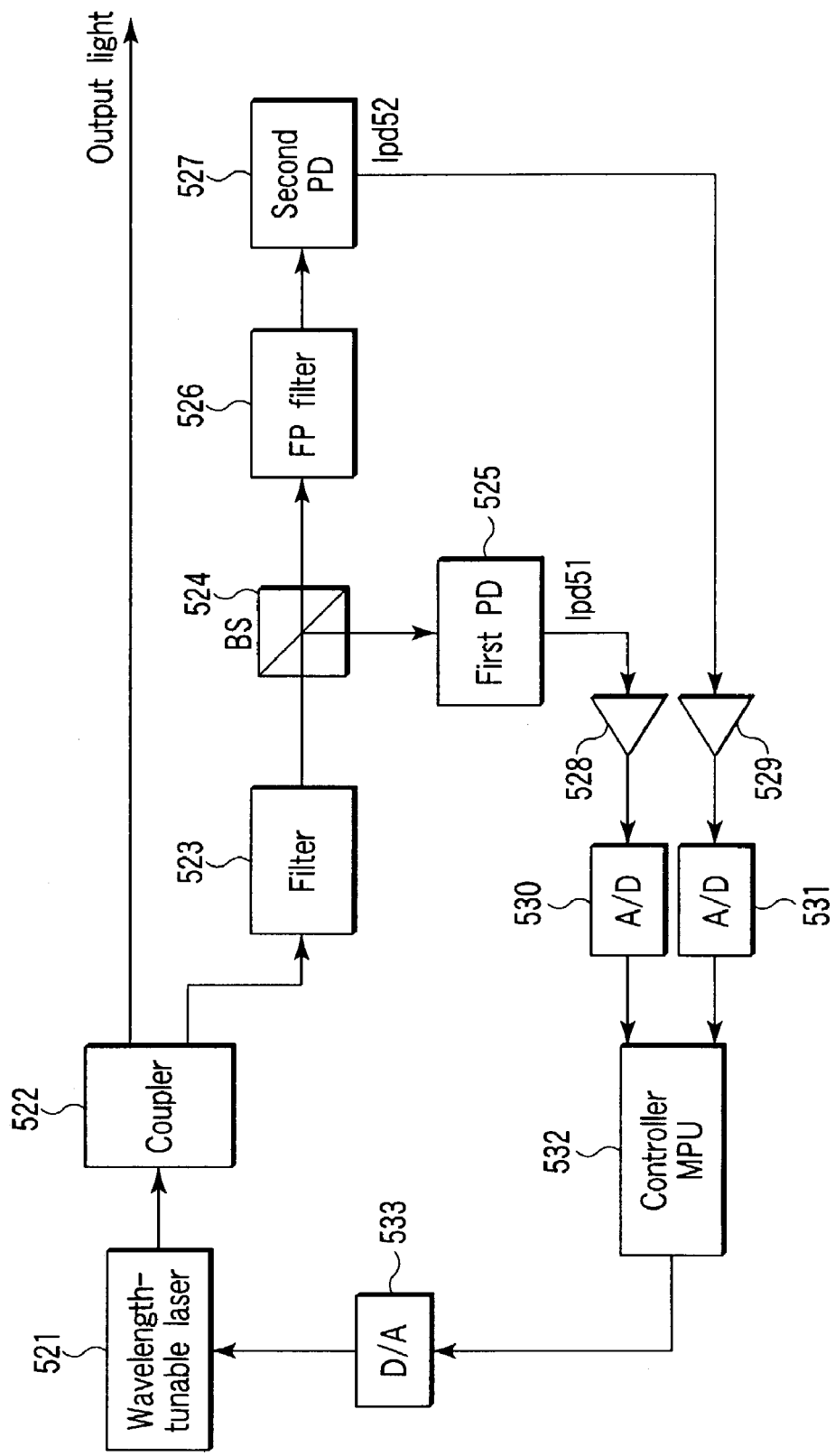
F I G. 23

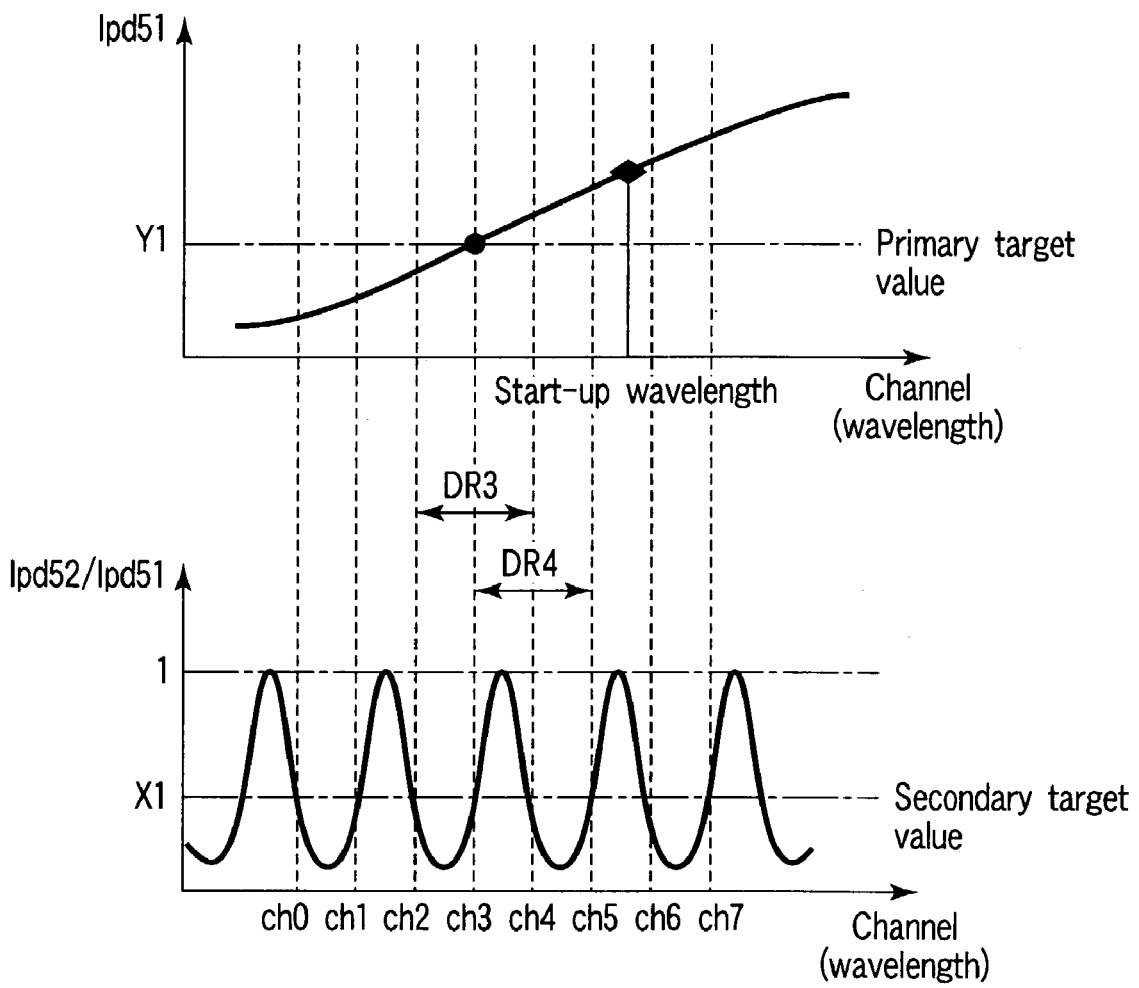
F I G. 24

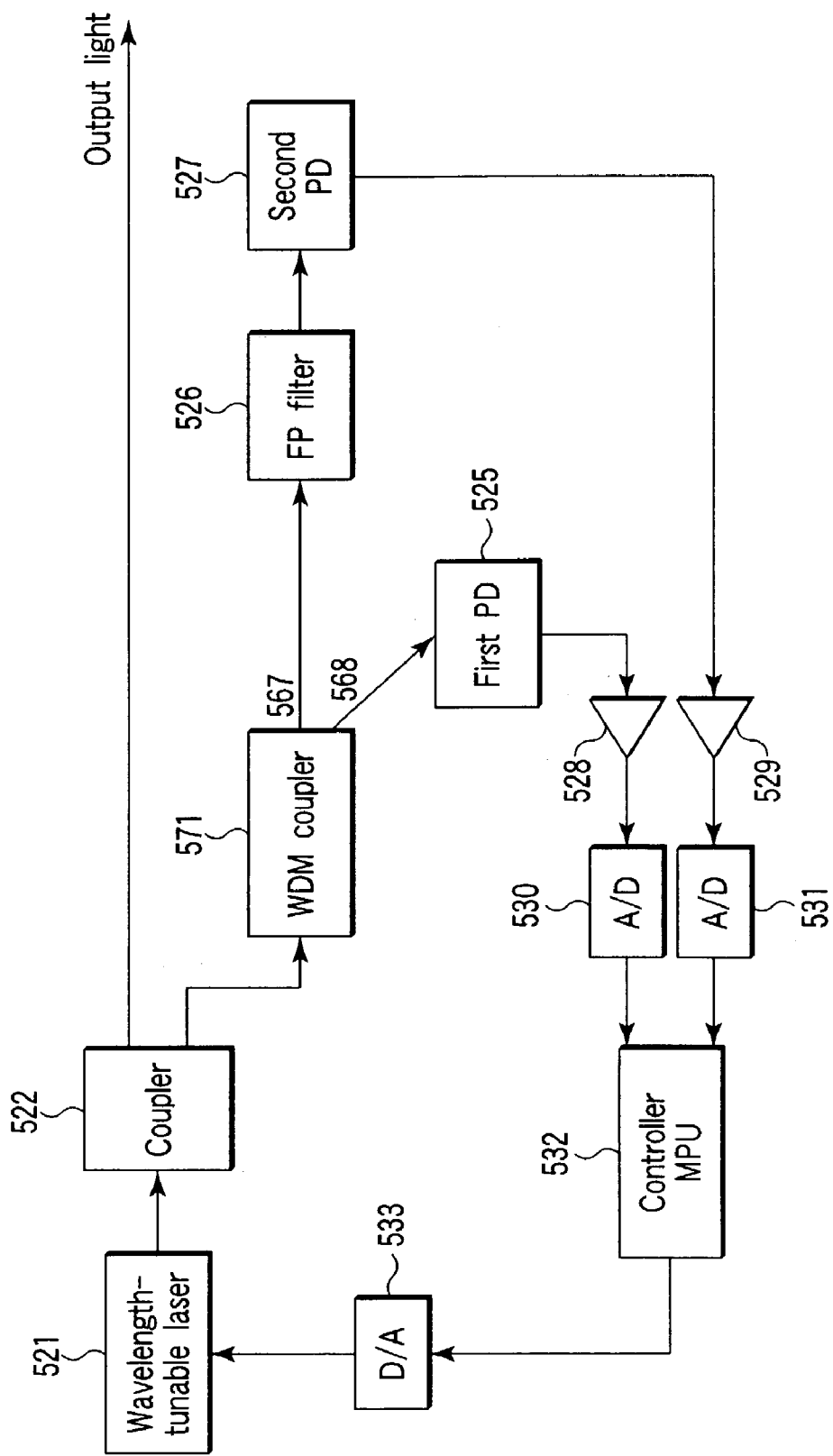
F I G. 31

US 7,139,450 B2

LASER TRANSMITTER DEVICE

CROSS-REFERENCE TO RELATED APPLICATIONS

This application is based upon and claims the benefit of priority from the prior Japanese Patent Application No. 2002-141496, filed May 16, 2002, the entire contents of which are incorporated herein by reference.

BACKGROUND OF THE INVENTION

1. Field of the Invention

The present invention relates to a laser transmitter device, and more particularly to a technique for locking the wavelength of light emitted from a laser light source for optical communication at a predetermined wavelength.

2. Description of the Related Art

As a method of increasing the capacity of optical communication, a DWDM (Dense Wavelength-Division Multiplexing) method is known. Since DWDM optical communication has advantages in that, e.g., it can effectively utilize properties of optical fibers in terms of broad band and large capacity, it is considered as a promising method, and research and development thereof proceed. Light sources used in DWDM optical communication are required to output laser light with a plurality of different wavelengths. The wavelengths have to be set at wavelengths decided for respective channels based on a recommendation from ITU-T (International Telecommunication Union—Telecommunication Standardization Section).

For example, in the case of a conventional DWDM optical communication system, which performs wavelength multiplex of 32 wavelengths, it is provided with 32 semiconductor lasers for oscillating laser light with wavelengths different from each other, or 32 wavelength-tunable lasers, which can change their oscillation wavelengths by adjusting the laser temperature or driving current. DFB (Distributed Feedback) lasers or DBR (Distributed Bragg Reflector) lasers are used as the wavelength-tunable lasers.

Particularly, where wavelength-tunable lasers are used, it is possible to reduce the number of kinds of semiconductor lasers used as ordinary-use light sources and preparatory light sources in a light source system for DWDM optical communication. For example, in a DWDM optical communication system with 32 wavelengths, if one semiconductor laser is used for one wavelength, it is necessary to use 64 semiconductor lasers in total, consisting of 32 ordinary-use light sources and 32 preparatory light sources. On the other hand, if wavelength-tunable semiconductor lasers each being capable of oscillating 8 wavelengths are used, only 4 kinds of lasers suffice the preparatory light sources.

Each of these semiconductor lasers has a diffraction grating whose pitch or the like is designed to oscillate single mode laser light with a predetermined wavelength in a steady state, but it is not always locked at the predetermined wavelength. For example, at the startup, the semiconductor laser normally does not oscillate at the predetermined wavelength. Even in the steady state, there are certain fluctuations. Accordingly, any wavelength-tunable laser capable of oscillating a plurality of wavelengths suffers the phenomena described above, and thus it is necessary to stabilize it at an aimed one of predetermined wavelengths.

As described above, in DWDM optical communication, the oscillation wavelength of each semiconductor laser has to be set at a predetermined channel wavelength with high accuracy. Since the oscillation wavelength of each semiconductor laser varies with time, a wavelength monitor function is added to keep the oscillation wavelength constant.

FIG. 32 is a view showing the internal structure of a CW (continuous-wave) laser transmitter device (module) with a conventional wavelength monitor function built therein. This device 10 includes a DFB laser (light source) 11, an FP (Fabry-Perot) filter 16, monitor PDs (Photo Diode) 17 and 34, and so forth. These members are mounted, through a carrier 18, on a Peltier element 19 for temperature control. Light emitted forward from the DFB laser 11 focuses on an optical fiber 14 through lenses 12 and 13.

Light emitted backward from the DFB laser 11 in the reverse direction relative to the optical fiber 14 passes through a lens 15 and is divided into two parts by a beam splitter 32. One of the light outputs divided by the beam splitter 32 passes through an FP filter 16 and is incident on a monitor PD 17, which outputs an electric current in accordance with reception light intensity. The FP filter 16 is designed to have an FSR (Free Spectral Range) equal to the channel intervals in DWDM optical communication. The other of the light outputs divided by the beam splitter 32 is directly incident on a monitor PD 34.

For example, the DFB laser (wavelength-tunable laser) 11 is assigned to 4 channels ch1 to ch4 with wavelength intervals of 100 GHz (about 0.8 nm) based on an ITU-T recommendation. The DFB laser 11 oscillates light with a wavelength corresponding to one of 4 channels, while its temperature being controlled by the Peltier element 19.

The output current of the monitor PD 17 is used by a controller (wavelength lock control circuit (AFC)) 21 to adjust the temperature of the Peltier element 19, so as to control the oscillation wavelength of the DFB laser 11 to be constant. On the other hand, the output current of the monitor PD 34 is used by a controller (output control circuit (APC)) 36 to adjust the current fed to the DFB laser 11, so as to control the intensity of the optical output of the DFB laser 11 to be constant. Each of the controllers 21 and 36 is formed of, e.g., an MPU (Microprocessor Unit) for control.

FIG. 33 is a graph showing the wavelength dependency of the output current Ipd of the monitor PD 17 in the laser transmitter device shown in FIG. 32. In FIG. 33, the horizontal axis denotes the DFB laser oscillation wavelength, and the vertical axis denotes the monitor output current. The output current Ipd periodically changes with the wavelength, in the same cycle as the channel intervals, because it reflects the transmission characteristic of the FP filter 16. In this conventional example, when the output current Ipd takes on a target value X0, the oscillation wavelength coincides with one of the channel wavelengths.

FIG. 34 is a view for explaining a wavelength control operation in the laser transmitter device shown in FIG. 32. In this wavelength control operation, the temperature of the DFB laser 11 is controlled by the Peltier element 19 so that the output current Ipd takes on the target value X0. The controller 21 receives the output current Ipd, and, when the output current Ipd is larger than the target value X0 (a point Ja in FIG. 34), it controls the oscillation wavelength to be longer. Conversely, when the output current Ipd is smaller than the target value X0 (a point Jb in FIG. 34), it controls the oscillation wavelength to be shorter. As a consequence, the output current Ipd is always kept at the target value X0, i.e., the oscillation wavelength of the DFB laser 11 is stabilized at an aimed channel wavelength.

FIG. 35 is a graph showing the wavelength dependency of the output current Ipd of the monitor PD 17, in a case where the increase and decrease in a control parameter for the oscillation wavelength (such as temperature) is controlled in reverse between the even-numbered channels and odd-numbered channels, so that the size of the channel intervals can be halved. In this case, for example, the DFB laser 11 is assigned to 8 channels ch0 to ch7 with wavelength intervals of 50 GHz (about 0.4 nm) based on an ITU-T recommendation. The FP filter 16 is designed to have an FSR equal to two times the channel intervals in DWDM optical communication.

In the control method shown in the FIG. 35, when the oscillation wavelength of the DFB laser 11 is tuned to (stabilized at) an even-numbered channel, the controller 21 performs a wavelength control operation, as follows. Specifically, when the DFB laser 11 starts up, the controller 21 receives an instruction to tune the wavelength at the even-numbered channel. If the output current Ipd is larger than the target value X0, the controller 21 controls the oscillation wavelength to be longer. If the output current Ipd is smaller than the target value X0, the controller 21 controls the oscillation wavelength to be shorter.

In the control method shown in the FIG. 35, when the oscillation wavelength of the DFB laser 11 is tuned to (stabilized at) an odd-numbered channel, the controller 21 performs a wavelength control operation in reverse to that described above, as follows. Specifically, when the DFB laser 11 starts up, the controller 21 receives an instruction to tune the wavelength at the odd-numbered channel. If the output current Ipd is larger than the target value X0, the controller 21 controls the oscillation wavelength to be shorter. If the output current Ipd is smaller than the target value X0, the controller 21 controls the oscillation wavelength to be longer.

However, in either case of using the control method shown in FIG. 33 or 35, when the DFB laser 11 starts up, it does not necessarily oscillate at a predetermined wavelength. Besides, the controller 21 controls the oscillation wavelength on the basis only of comparison in the magnitude relationship between the monitor current Ipd and target value X0. Furthermore, the transmission characteristic of the FP filter (such as an etalon) 16 relative to the wavelength shifts with the temperature change of the filter 16. As a consequence, the control of tuning the oscillation wavelength of the DFB laser 11 to a predetermined wavelength suffers problems described later.

Under the circumstances, there are demands for a laser transmitter device, which can reliably tune the oscillation wavelength of a laser light source for optical communication to a predetermined wavelength.

BRIEF SUMMARY OF THE INVENTION

According to a first aspect of the present invention, there is provided a laser transmitter device for dense wavelength-division multiplexing optical communication, comprising:

a laser light source, whose oscillation wavelength is tunable;

a first optical element having a first optical characteristic with wavelength dependency, whose light transmissivity or reflectivity shows a monotone increase or monotone decrease within a wavelength range over a plurality of channels in the optical communication;

a second optical element having a second optical characteristic with wavelength dependency, whose transmissivity or reflectivity changes in a cycle corresponding to intervals of the channels or two times the intervals;

a first detection element configured to detect an intensity of light emitted from the laser light source and coming via the first optical element, and generate a first electric signal reflecting the first optical characteristic; and a second detection element configured to detect an intensity of light emitted from the laser light source and coming via the second optical element, and generate a second electric signal reflecting the second optical characteristic.

According to a second aspect of the present invention, there is provided a laser transmitter device for dense wavelength-division multiplexing optical communication, comprising:

a laser light source, whose oscillation wavelength is tunable;

an optical element having an optical characteristic with wavelength dependency, whose transmissivity or reflectivity changes in a cycle corresponding to intervals of the channels in the optical communication or two times the intervals;

a first detection element having a first sensitivity characteristic with wavelength dependency, whose optical sensitivity shows a monotone increase or monotone decrease within a wavelength range over a plurality of channels in the optical communication, and configured to detect an intensity of light emitted from the laser light source, and generate a first electric signal reflecting the first sensitivity characteristic; and a second detection element having a second sensitivity characteristic, whose optical sensitivity is substantially constant within the wavelength range, and configured to detect an intensity of light emitted from the laser light source and coming via the optical element, and generate a second electric signal reflecting the optical characteristic.

BRIEF DESCRIPTION OF THE SEVERAL VIEWS OF THE DRAWING

FIG. 9 is a view showing the internal structure of a CW laser transmitter device (module) according to a sixth embodiment of the present invention;

FIG. 10 is a graph showing the wavelength dependency of the output currents of monitor PDs in the sixth embodiment;

FIG. 22 is a block diagram showing a laser transmitter device according to a fourteenth embodiment of the present invention;

FIG. 23 is a block diagram showing a laser transmitter device according to a fifteenth embodiment of the present invention;

FIG. 24 is a graph showing the wavelength dependency of the output current of a first PD and a monitor output obtained by normalizing the output current of a second PD in the fifteenth embodiment;

FIG. 31 is a block diagram showing a laser transmitter device according to an eighteenth embodiment of the present invention;

DETAILED DESCRIPTION OF THE INVENTION

In the process of developing the present invention, the inventors conducted research on problems of a conventional laser transmitter device and control method thereof, as shown in FIGS. 32 to 35. As a result, the inventors have arrived at the finding given below.

Figure 34:
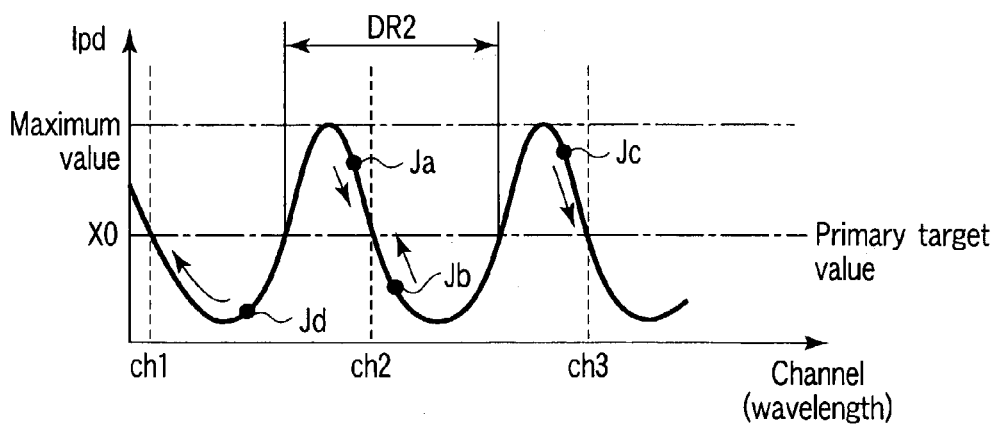
FIG. 34 is a view for explaining a wavelength control operation in the laser transmitter device shown in FIG. 32.

For example, let's take a case where the oscillation wavelength of the DFB laser 11 is tuned to channel ch2 in FIG. 34. When the DFB laser 11 starts up with a wavelength at a point Ja or Jb in FIG. 34, the conventional control method described above allows the oscillation wavelength to be stabilized at the desired channel ch2. However, when the DFB laser 11 starts up with a wavelength at a point Jc or Jd, the conventional control method causes the oscillation wavelength to be adjusted to a channel wavelength different from channel ch2. Specifically, each channel has its own wavelength range (to be referred to as a wavelength capture range) in which the oscillation wavelength can be led to this channel. When the start-up oscillation wavelength does not fall within this range, it is tuned to a channel different from the desired channel. In FIG. 34, a range DR2 denotes the wavelength capture range of channel ch2.

Figure 35:
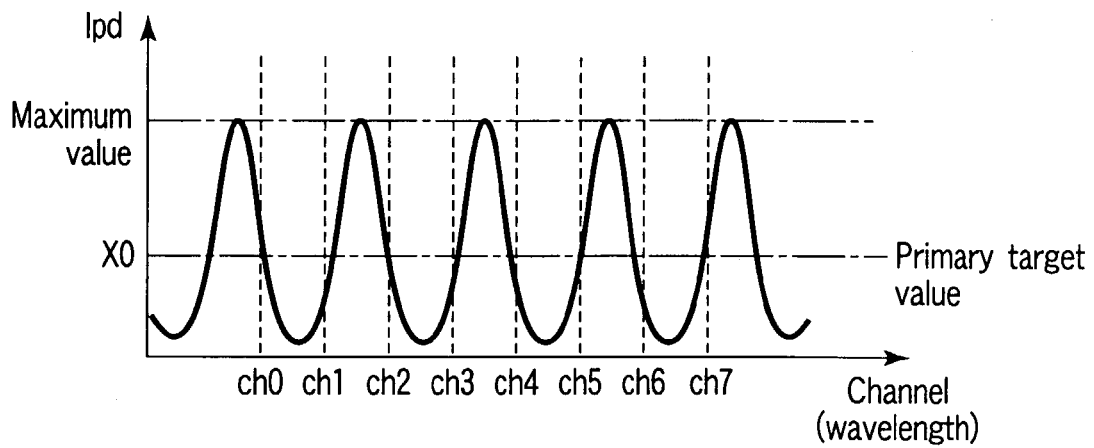
FIG. 35 is a graph showing the wavelength dependency of the output current of a monitor PD, in a case where the increase and decrease in a control parameter for the oscillation wavelength (such as temperature) is controlled in reverse between the even-numbered channels and odd-numbered channels, so that the size of the channel intervals can be halved.

In order to compensate for this problem, another observation system and controller (ATC: Automatic Temperature Control) are sometimes used for the laser temperature. The above-described "wavelength capture range" denotes a wavelength range in which the controller 21 can stabilize the oscillation wavelength of the laser at a predetermined channel, without using such observation system and ATC for the laser temperature. Where the channel intervals are the same as each other between the control methods shown in FIGS. 33 and 35, the captured wavelength in FIG. 35 can be twice the captured wavelength in FIG. 33. This is so, because, according to the control method shown in FIG. 35, an even-numbered channel and odd-numbered channel adjacent to each other use their wavelength capture ranges, such that the two ranges overlap with each other by half. Since the wavelength capture range is determined by the FSR of the FP filter 16, the FP filter 16 according to the control method shown in FIG. 35 is designed to have an FSR equal to two times the size of the channel intervals in DWDM optical communication.

The FP filter (such as etalon) 16 used for monitoring the wavelength is a filter whose transmission characteristic has wavelength dependency. A filter of this kind is structured such that a light-transmitting base body, such as quartz or crystallized quartz in general, is provided with reflection films formed on its two opposite surfaces, to have wavelength dependency in the transmission characteristic. When the filter thus formed receives a temperature influence, its optical path length changes due to the thermal expansion of the base body, thereby shifting the transmission characteristic relative to wavelength.

Although the FP filter 16 is mounted on the Peltier element 19, the temperature of the FP filter 16 changes with the change in ambient temperature around the device (module) 10, depending on radiation heat from the package of the device 10, and the thermal conductivity of the filter base body. When the temperature of the FP filter 16 changes, the transmission characteristic of the FP filter 16 relative to wavelength shifts. The shift amount of the transmission characteristic is about 10 pm/° C. in the case of a quartz base body, while it is 5 pm/° C. in the case of a crystallized quartz base body, which is referred to as being less sensitive.

Figure 32:
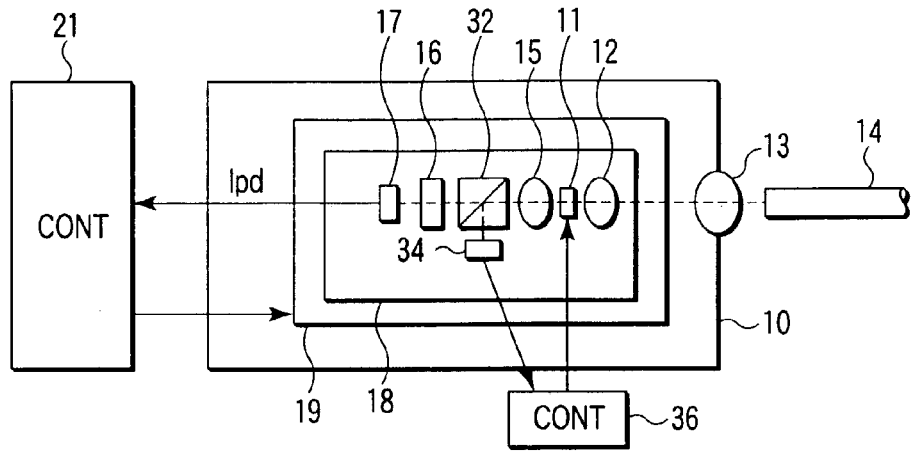
FIG. 32 is a view showing the internal structure of a CW laser transmitter device (module) with a conventional wavelength monitor function built therein.
Figure 33:
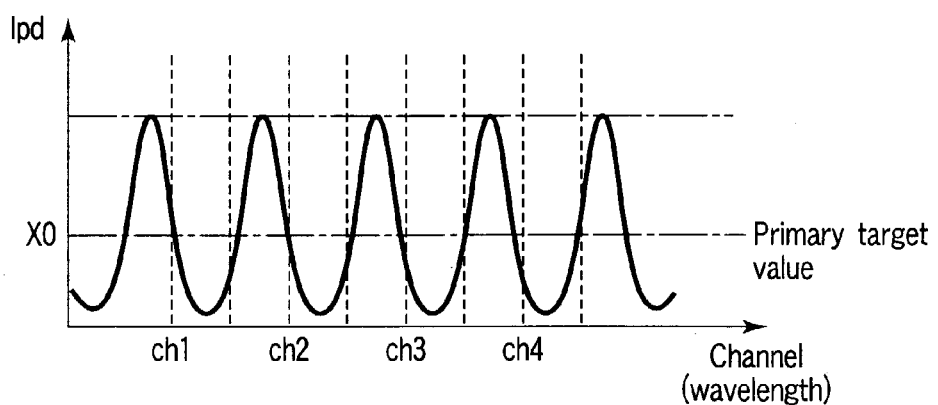
FIG. 33 is a graph showing the wavelength dependency of the output current of a monitor PD in the laser transmitter device shown in FIG. 32.
Figure 36:
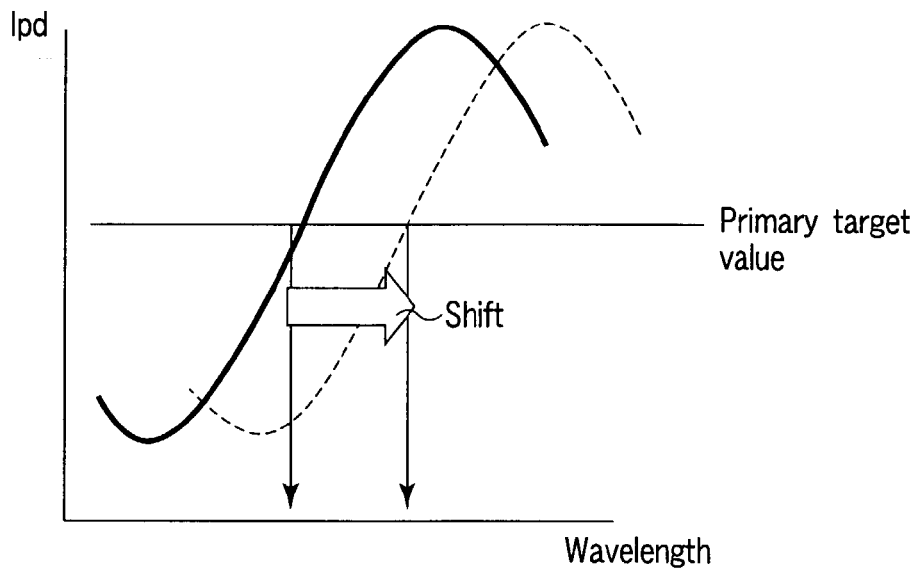
FIG. 36 is a graph showing the monitor output current of a monitor PD in the laser transmitter device shown in FIG. 32, where the transmission characteristic of an FP filter relative to the wavelength shifts.

FIG. 36 is a graph showing the monitor output current Ipd of the monitor PD 17 in the device 10 shown in FIG. 32, where the transmission characteristic of an FP filter relative to the wavelength shifts. In FIG. 36, the horizontal axis denotes the oscillation wavelength of the DFB laser, and the vertical axis denotes the monitor output current. If such a shift in transmission characteristic occurs, the oscillation wavelength of the device 10 deviates from the predetermined channel wavelength, when the control circuit 21 controls the temperature of the Peltier element 19 with reference to the output of the monitor PD 17.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

(First Embodiment)

Figure 1:
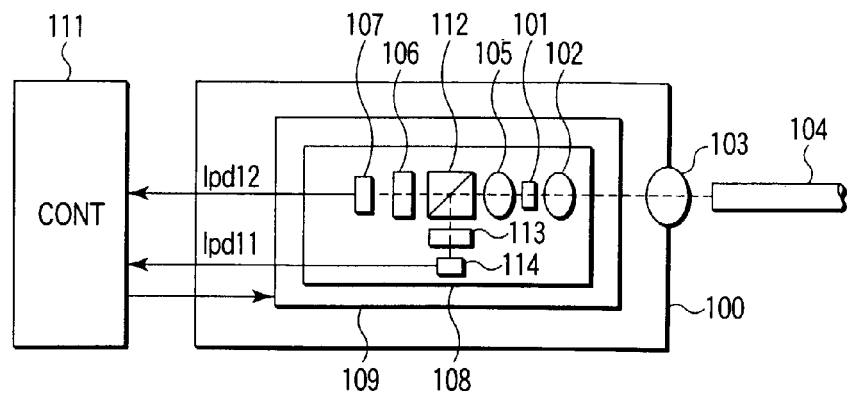
FIG. 1 is a view showing the internal structure of a CW (continuous-wave) laser transmitter device (module) according to a first embodiment of the present invention.

FIG. 1 is a view showing the internal structure of a CW laser transmitter device (module) according to a first embodiment of the present invention. This device 100 includes a DFB semiconductor laser (light source) 101, filters 106 and 113, monitor PDs 107 and 114, a beam splitter 112, and so forth. These members are mounted, through a carrier 108, on a Peltier element 109 for temperature control. Light emitted forward from the DFB laser 101 focuses on an optical fiber 104 through lenses 102 and 103.

Light emitted backward from the DFB laser 101 in the reverse direction relative to the optical fiber 104 passes through a lens 105 and is divided into two parts by the beam splitter 112. One of the light outputs divided by the beam splitter 112 passes through the filter 106 and is incident on the monitor PD 107. The other of the light outputs divided by the beam splitter 112 passes through the filter 113 and is incident on the monitor PD 114.

The filter 113 is formed of a low pass filter or band pass filter, which is designed to have light transmissivity expressed by a characteristic line with a slant portion extending over a plurality of channels in DWDM optical communication. In this embodiment, the filter 113 has a characteristic such that the light transmissivity shows a monotone increase with the increase in wavelength (having no extreme value in the range) entirely over the wavelength range (such as channels ch1 to ch4) that the DFB laser 101 is assigned to in DWDM optical communication. The filter 113 may be formed of a periodic filter having an FSR, a half of which is larger than the entire wavelength range that the DFB laser 101 is assigned to. On the other hand, the filter 106 is designed to have an FSR equal to the channel intervals in DWDM optical communication. Specifically, the light transmissivity of the filter 106 changes in a cycle corresponding to the channel intervals.

Figure 2:
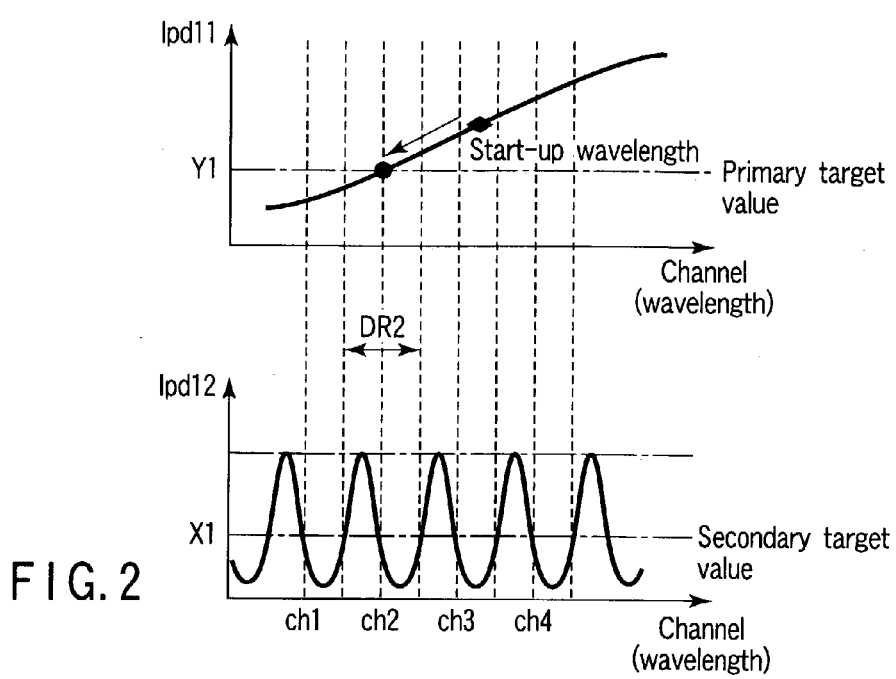
FIG. 2 is a graph showing the wavelength dependency of the output currents of monitor PDs in the first embodiment.

FIG. 2 is a graph showing the wavelength dependency of the output currents Ipd11 and Ipd12 of the monitor PDs 114 and 107 in the first embodiment. In FIG. 2, the horizontal axis denotes the DFB laser oscillation wavelength, and the vertical axis denotes the monitor output current. The output current Ipd11 from the monitor PD 114 shows wavelength dependency including a monotone increase over a plurality of channels, because it reflects the transmission characteristic of the filter 113. On the other hand, the output current Ipd12 from the monitor PD 107 periodically changes with the wavelength in the same cycle as the channel intervals, because it reflects the transmission characteristic of the filter 106.

For example, when the oscillation wavelength of the DFB laser 101 is tuned to channel ch2, the controller (such as an MPU for control) 111 performs a wavelength control operation, as follows. Specifically, when the DFB laser 101 starts up, the temperature of the DFB laser 101 is first adjusted by the Peltier element 109, so that the value of the monitor output current Ipd11 comes close to a primary target value Y1. Then, the temperature of the DFB laser 101 is accurately controlled by the Peltier element 109, so that the value of the monitor output current Ipd12 takes on a secondary target value X1.

In summary, the oscillation wavelength of the DFB laser 101 is first adjusted (a first stage adjustment) into the wavelength capture range of a predetermined channel (such as the wavelength capture range DR2 of channel ch2) on the basis of the monitor output current Ipd11, and then is accurately tuned (a second stage adjustment) to the predetermined channel on the basis of the monitor output current Ipd12. As a consequence, the oscillation wavelength of the DFB laser 101 is accurately controlled to be a desired channel wavelength, without reference to the start-up oscillation wavelength.

For the sake of easy understanding, FIG. 1 shows no automatic output control system for the DFB laser 101, which comprises the monitor PD 34, controller 36, and so forth in FIG. 32. However, the device 100 shown in FIG. 1 also includes such an automatic output control system, which adjusts the current fed to the DFB laser 101, so that the light output of the DFB laser 101 is controlled to be constant.

(Second Embodiment)

Figure 3:
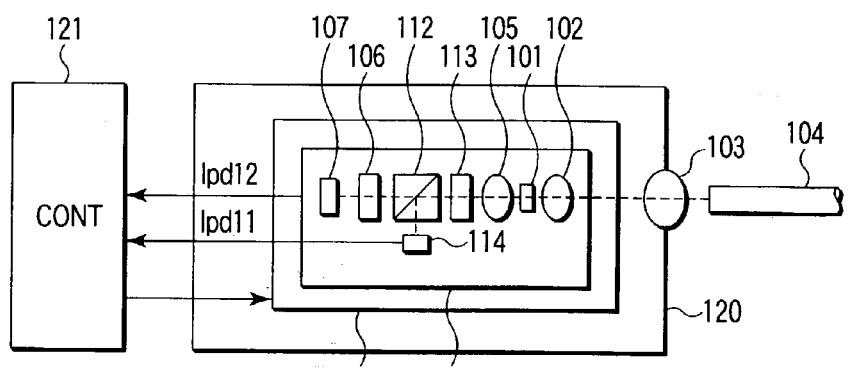
FIG. 3 is a view showing the internal structure of a CW laser transmitter device (module) according to a second embodiment of the present invention.

FIG. 3 is a view showing the internal structure of a CW laser transmitter device (module) according to a second embodiment of the present invention. In this device 120, a filter 113 is disposed between a DFB laser 101 and a beam splitter 112. The other members are arranged in the same manner as in the device 100 shown in FIG. 1. Light emitted backward from the DFB laser 101 in the reverse direction relative to an optical fiber 104 passes through the filter 113 and is divided into two parts by the beam splitter 112. One of the light outputs divided by the beam splitter 112 passes through a filter 106 and is incident on a monitor PD 107. The other of the light outputs divided by the beam splitter 112 is directly incident on a monitor PD 114.

Figure 4:
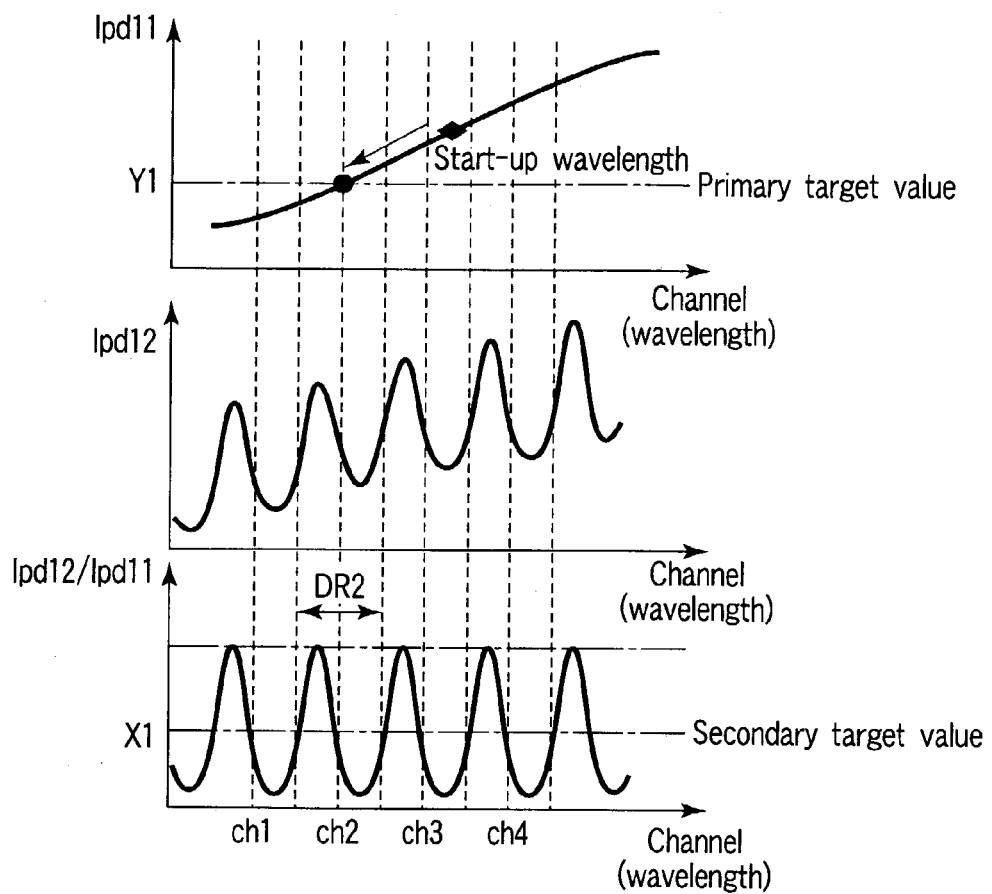
FIG. 4 is a graph showing the wavelength dependency of the output currents of monitor PDs in the second embodiment.

FIG. 4 is a graph showing the wavelength dependency of the output currents Ipd11 and Ipd12 of the monitor PDs 114 and 107 in the second embodiment. In FIG. 4, the horizontal axis denotes the DFB laser oscillation wavelength, and the vertical axis denotes the monitor output current or a normalized monitor output. The output current Ipd11 from the monitor PD 114 shows wavelength dependency including a monotone increase over a plurality of channels, because it reflects the transmission characteristic of the filter 113. On the other hand, the output current Ipd12 from the monitor PD 107 reflects both the transmission characteristics of the filters 113 and 106, because the monitor PD 107 receives light having passed through both the filters 113 and 106. As a consequence, the output current Ipd12 shows wavelength dependency such that it changes in the same cycle as the channel intervals while it increases along with the cyclic (periodic) change with the increase in wavelength. However, in a controller (such as an MPU for control) 121, the Ipd12 is then normalized with the Ipd11 to calculate a value (Ipd12/Ipd11), thereby extracting a monitor output, which only shows the transmission characteristic of the filter 106.

For example, when the oscillation wavelength of the DFB laser 101 is tuned to channel ch2, the controller 121 performs a wavelength control operation, as follows. Specifically, when the DFB laser 101 starts up, the temperature of the DFB laser 101 is first adjusted by the Peltier element 109, so that the value of the monitor output current Ipd11 comes close to a primary target value Y1. Then, the temperature of the DFB laser 101 is accurately controlled by the Peltier element 109, so that the value of the normalized monitor output Ipd12/Ipd11 takes on a secondary target value X1.

In summary, the oscillation wavelength of the DFB laser 101 is first adjusted (a first stage adjustment) into the wavelength capture range of a predetermined channel (such as the wavelength capture range DR2 of channel ch2) on the basis of the monitor output current Ipd11, and then is accurately tuned (a second stage adjustment) to the predetermined channel on the basis of the normalized monitor output Ipd12/Ipd11. As a consequence, the oscillation wavelength of the DFB laser 101 is accurately controlled to be a desired channel wavelength, without reference to the start-up oscillation wavelength.

According to the second embodiment, since the filter 113 is disposed between the DFB laser 101 and beam splitter 112, the members inside the device 100 can be arranged in a long and narrow layout. Furthermore, since the second stage adjustment is performed on the basis of the normalized monitor output Ipd12/Ipd11, it is possible to compensate for the output fluctuation due to noise, temperature variation, deterioration with time, or the like.

(Third Embodiment)

Figure 5:
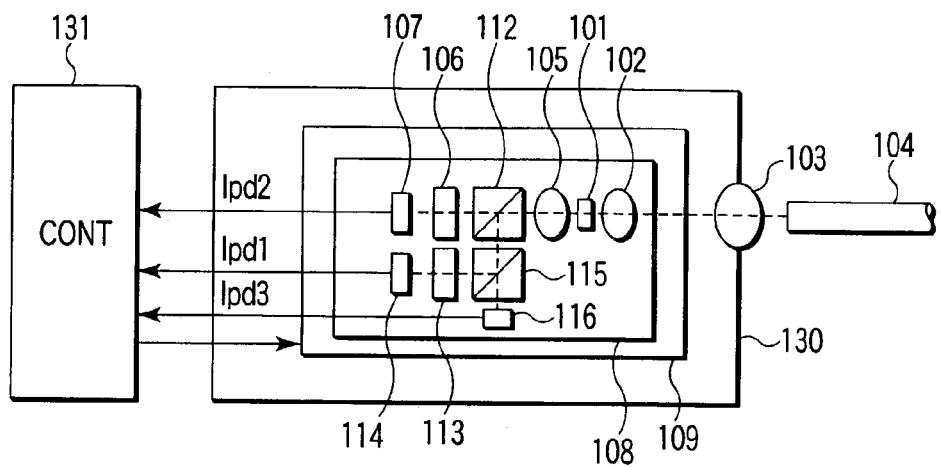
FIG. 5 is a view showing the internal structure of a CW laser transmitter device (module) according to a third embodiment of the present invention.

FIG. 5 is a view showing the internal structure of a CW laser transmitter device (module) according to a third embodiment of the present invention. In this device 130, output light from a beam splitter 112 toward a monitor PD 114 is further divided into two parts by a beam splitter 115. One of the light outputs divided by the beam splitter 115 passes through a filter 113 and is incident on a monitor PD 114. The other of the light outputs divided by the beam splitter 115 is incident on a monitor PD 116 without passing through any filter. Specifically, the monitor PD 116 presents an output with a current value Ipd13 in accordance with the light intensity itself of a DFB laser 101. The other members are arranged in the same manner as in the device 100 shown in FIG. 1.

In a practical laser transmitter device, when the temperature of a laser is changed, not only the oscillation wavelength but also the light intensity changes. Furthermore, light intensity fluctuation is caused by variation with time. In order to remove the influence of this light intensity fluctuation, a controller (such as an MPU for control) 131 performs a wavelength control operation, while using monitor outputs obtained by normalizing the output currents Ipd11 and Ipd12 from the monitor PDs 114 and 107 with the output current Ipd13 from the monitor PD 116. Specifically, the oscillation wavelength of the DFB laser 101 is first adjusted (a first stage adjustment) into the wavelength capture range of a predetermined channel on the basis of a normalized monitor output Ipd11/Ipd13, and then is accurately tuned (a second stage adjustment) to the predetermined channel on the basis of a normalized monitor output Ipd12/Ipd13.

The output current Ipd13 from the monitor PD 116 can be used as a detection signal in an automatic output control system for the DFB laser 101. In this case, the current fed to the DFB laser 101 can be controlled to keep the output current Ipd13 constant by a suitable output control circuit (APC).

According to the third embodiment, the first stage and second stage adjustments are performed on the basis of the normalized monitor outputs Ipd11/Ipd13 and Ipd12/Ipd13, it is possible to reliably compensate for the output fluctuation due to noise, temperature variation, deterioration with time, or the like.

(Fourth Embodiment)

Figure 6:
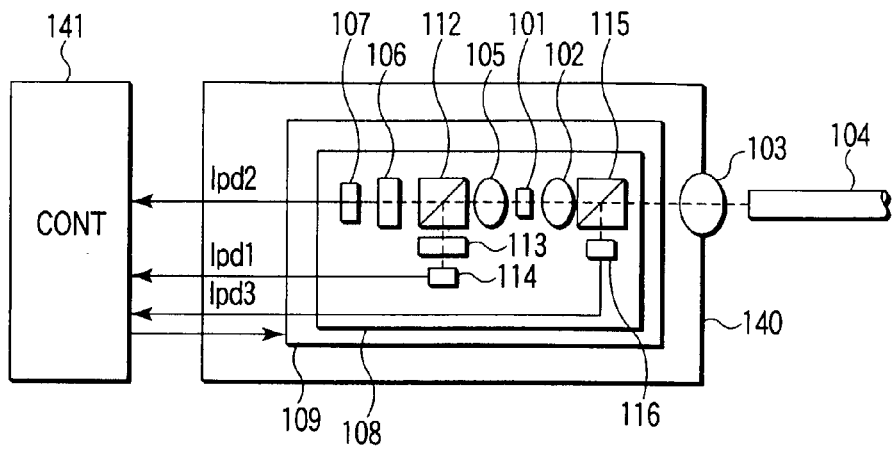
FIG. 6 is a view showing the internal structure of a CW laser transmitter device (module) according to a fourth embodiment of the present invention.

FIG. 6 is a view showing the internal structure of a CW laser transmitter device (module) according to a fourth embodiment of the present invention. This device 140 includes three monitor PDs 107, 114, and 116 for the same purposes as those in the device shown in FIG. 5. However, a beam splitter 115 divides light emitted forward from a DFB laser 101, and one of the light outputs thus divided is incident on the monitor PD 116. In other words, means for extracting the monitor output can be disposed to either light emitted forward or light emitted backward from the DFB laser 101. A controller (such as an MPU for control) 141 performs a wavelength control operation in the same manner as the controller 131 according to the third embodiment.

(Matters Common to First to Fourth Embodiments)

In the first to fourth embodiments, conversely to the explanation in these embodiments, the filter 113 may have a characteristic such that the light transmissivity shows a monotone decrease with the increase in wavelength over the predetermined wavelength range (i.e., no extreme value in the range). The predetermined wavelength range denotes a range over a plurality of channels in DWDM optical communication, for example, a range entirely over the wavelengths (such as channels ch1 to ch4) that the DFB laser 101 is assigned to.

(Fifth Embodiment)

Figure 7:
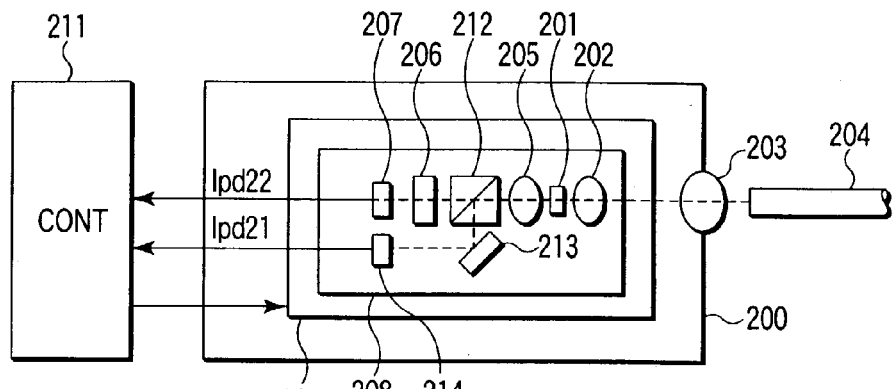
FIG. 7 is a view showing the internal structure of a CW laser transmitter device (module) according to a fifth embodiment of the present invention.

FIG. 7 is a view showing the internal structure of a CW laser transmitter device (module) according to a fifth embodiment of the present invention. This device 200 includes a DFB semiconductor laser (light source) 201, a filter 206, a reflector 213, monitor PDs 207 and 214, a beam splitter 212, and so forth. These members are mounted, through a carrier 208, on a Peltier element 209 for temperature control. Light emitted forward from the DFB laser 201 focuses on an optical fiber 204 through lenses 202 and 203.

Light emitted backward from the DFB laser 201 in the reverse direction relative to the optical fiber 204 passes through a lens 205 and is divided into two parts by the beam splitter 212. One of the light outputs divided by the beam splitter 212 passes through the filter 206 and is incident on the monitor PD 207. The other of the light outputs divided by the beam splitter 212 is reflected by the reflector 213 and is incident on the monitor PD 214.

The reflector 213 is designed to have an optical characteristic with wavelength dependency in the light reflectivity, which is expressed by a characteristic line with a slant portion extending over a plurality of channels in DWDM optical communication. In this embodiment, the reflector 213 has a characteristic such that the light reflectivity shows a monotone decrease with the increase in wavelength (having no extreme value in the range) entirely over the wavelength range (such as channels ch1 to ch4) that the DFB laser 201 is assigned to in DWDM optical communication. On the other hand, the filter 206 is designed to have an FSR equal to the channel intervals in DWDM optical communication. Specifically, the light transmissivity of the filter 206 changes in a cycle corresponding to the channel intervals.

Figure 8:
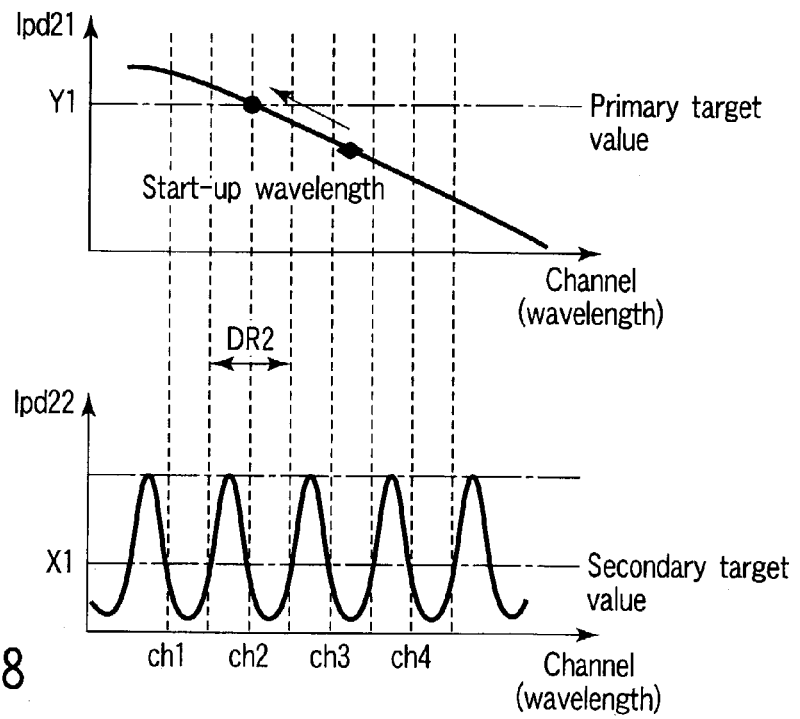
FIG. 8 is a graph showing the wavelength dependency of the output currents of monitor PDs in the fifth embodiment.

FIG. 8 is a graph showing the wavelength dependency of the output currents Ipd21 and Ipd22 of the monitor PDs 214 and 207 in the fifth embodiment. In FIG. 2, the horizontal axis denotes the DFB laser oscillation wavelength, and the vertical axis denotes the monitor output current. The output current Ipd21 from the monitor PD 214 shows wavelength dependency including a monotone decrease over a plurality of channels, because it reflects the reflection characteristic of the reflector 213. On the other hand, the output current Ipd22 from the monitor PD 207 periodically changes with the wavelength in the same cycle as the channel intervals, because it reflects the transmission characteristic of the filter 206.

For example, when the oscillation wavelength of the DFB laser 201 is tuned to channel ch2, the controller (such as an MPU for control) 211 performs a wavelength control operation, as follows. Specifically, when the DFB laser 201 starts up, the temperature of the DFB laser 201 is first adjusted by the Peltier element 209, so that the value of the monitor output current Ipd21 comes close to a primary target value Y1. Then, the temperature of the DFB laser 201 is accurately controlled by the Peltier element 209, so that the value of the monitor output current Ipd22 takes on a secondary target value X1.

In summary, the oscillation wavelength of the DFB laser 201 is first adjusted (a first stage adjustment) into the wavelength capture range of a predetermined channel (such as the wavelength capture range DR2 of channel ch2) on the basis of the monitor output current Ipd21, and then is accurately tuned (a second stage adjustment) to the predetermined channel on the basis of the monitor output current Ipd22. As a consequence, the oscillation wavelength of the DFB laser 201 is accurately controlled to be a desired channel wavelength, without reference to the start-up oscillation wavelength.

For the sake of easy understanding, FIG. 7 shows no automatic output control system for the DFB laser 201, which comprises the monitor PD 34, controller 36, and so forth in FIG. 32. However, the device 200 shown in FIG. 7 also includes such an automatic output control system, which adjusts the current fed to the DFB laser 201, so that the light output of the DFB laser 201 is controlled to be constant.

(Sixth Embodiment)

FIG. 9 is a view showing the internal structure of a CW laser transmitter device (module) according to a sixth embodiment of the present invention. In this device 220, the beam splitter 212 is excluded, and an optical element 223 used as a filter and reflector is disposed between a DFB laser 201 and a filter 206. For example, the optical element 223 is formed of a filter having a characteristic described below and disposed with 45-degree inclination relative to the light axis. The other members are arranged in the same manner as in the device 200 shown in FIG. 7. Light emitted backward from the DFB laser 201 in the reverse direction relative to an optical fiber 204 is divided into transmitted light and reflected light by the optical element 223. The light transmitted by the optical element 223 passes through a filter 206 and is incident on a monitor PD 207. The light reflected by the optical element 223 is directly incident on a monitor PD 214.

The optical element 223 is designed to have light transmissivity (light reflectivity≈1−light transmissivity) expressed by a characteristic line with a slant portion extending over a plurality of channels in DWDM optical communication. In this embodiment, the optical element 223 has a characteristic such that the light transmissivity shows a monotone increase with the increase in wavelength (having no extreme value in the range) entirely over the wavelength range (such as channels ch1 to ch4) that the DFB laser 201 is assigned to in DWDM optical communication. Accordingly, the optical element 223 also has a characteristic such that the light reflectivity shows a monotone decrease with the increase in wavelength entirely over the wavelength range described above. On the other hand, the filter 206 is designed to have an FSR equal to the channel intervals in DWDM optical communication.

FIG. 10 is a graph showing the wavelength dependency of the output currents Ipd21 and Ipd22 of the monitor PDs 214 and 207 in the second embodiment. In FIG. 10, the horizontal axis denotes the DFB laser oscillation wavelength, and the vertical axis denotes the monitor output current or a normalized monitor output. The output current Ipd21 from the monitor PD 214 shows wavelength dependency including a monotone decrease over a plurality of channels, because it reflects the reflection characteristic of the optical element 223. On the other hand, the output current Ipd22 from the monitor PD 207 reflects both the transmission characteristics of the optical element 223 and filter 206, because the monitor PD 207 receives light having passed through both the optical element 223 and filter 206. As a consequence, the output current Ipd22 shows wavelength dependency such that it changes in the same cycle as the channel intervals while it increases along with the cyclic (periodic) change with the increase in wavelength.

However, in a controller (such as an MPU for control) 221, the Ipd22 is then normalized with the Ipd21, thereby extracting a monitor output, which only shows the transmission characteristic of the filter 206. Specifically, in the optical element 223, the transmitted light intensity is almost equal to a value obtained by subtracting the reflected light intensity from the incident light intensity. Accordingly, used as a denominator for normalizing the Ipd22 is a value (Imax−Ipd21) obtained by subtracting the Ipd21 from the Imax denoting a current when the monitor PD 214 receives all the light being reflected. Then, Ipd22/(Imax−Ipd21) is calculated as a normalized monitor output.

For example, when the oscillation wavelength of the DFB laser 201 is tuned to channel ch2, the controller 221 performs a wavelength control operation, as follows. Specifically, when the DFB laser 201 starts up, the temperature of the DFB laser 201 is first adjusted by the Peltier element 209, so that the value of the monitor output current Ipd21 comes close to a primary target value Y1. Then, the temperature of the DFB laser 201 is accurately controlled by the Peltier element 209, so that the value of the normalized monitor output Ipd22/(Imax−Ipd21) takes on a secondary target value X1.

In summary, the oscillation wavelength of the DFB laser 201 is first adjusted (a first stage adjustment) into the wavelength capture range of a predetermined channel (such as the wavelength capture range DR2 of channel ch2) on the basis of the monitor output current Ipd21, and then is accurately tuned (a second stage adjustment) to the predetermined channel on the basis of the normalized monitor output Ipd22/(Imax−Ipd21). As a consequence, the oscillation wavelength of the DFB laser 201 is accurately controlled to be a desired channel wavelength, without reference to the start-up oscillation wavelength.

According to the sixth embodiment, since the second stage adjustment is performed on the basis of the normalized monitor output Ipd22/(Imax−Ipd21), it is possible to compensate for the output fluctuation due to noise, temperature variation, deterioration with time, or the like.

(Seventh Embodiment)

Figure 11:
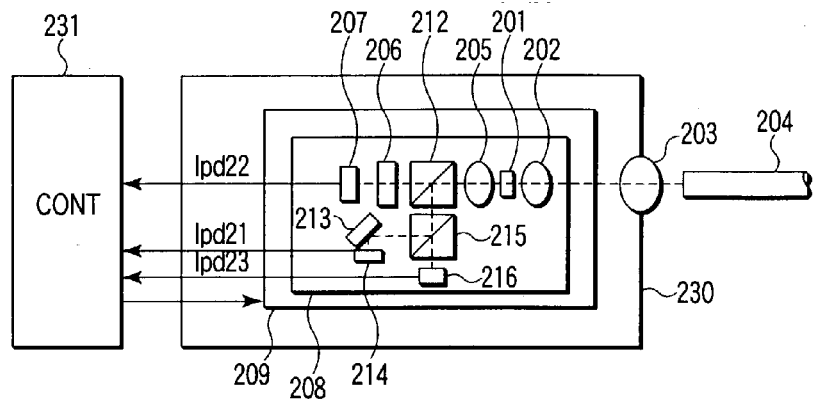
FIG. 11 is a view showing the internal structure of a CW laser transmitter device (module) according to a seventh embodiment of the present invention.

FIG. 11 is a view showing the internal structure of a CW laser transmitter device (module) according to a seventh embodiment of the present invention. In this device 230, output light from a beam splitter 212 toward a monitor PD 214 is further divided into two parts by a beam splitter 215. One of the light outputs divided by the beam splitter 215 is reflected by a reflector 213 and is incident on a monitor PD 214. The other of the light outputs divided by the beam splitter 215 is incident on a monitor PD 216 without engaging with any reflector. Specifically, the monitor PD 216 presents an output with a current value Ipd23 in accordance with the light intensity itself of a DFB laser 201. The other members are arranged in the same manner as in the device 200 shown in FIG. 7.

In a practical laser transmitter device, when the temperature of a laser is changed, not only the oscillation wavelength but also the light intensity changes. Furthermore, light intensity fluctuation is caused by variation with time. In order to remove the influence of this light intensity fluctuation, a controller (such as an MPU for control) 231 performs a wavelength control operation, while using monitor outputs obtained by normalizing the output currents Ipd21 and Ipd22 from the monitor PDs 214 and 207 with the output current Ipd23 from the monitor PD 216. Specifically, the oscillation wavelength of the DFB laser 201 is first adjusted (a first stage adjustment) into the wavelength capture range of a predetermined channel on the basis of a normalized monitor output Ipd21/Ipd23, and then is accurately tuned (a second stage adjustment) to the predetermined channel on the basis of a normalized monitor output Ipd22/Ipd23.

The output current Ipd23 from the monitor PD 216 can be used as a detection signal in an automatic output control system for the DFB laser 201. In this case, the current fed to the DFB laser 201 can be controlled to keep the output current Ipd23 constant by a suitable output control circuit (APC).

According to the seventh embodiment, the first stage and second stage adjustments are performed on the basis of the normalized monitor outputs Ipd21/Ipd23 and Ipd22/Ipd23, it is possible to reliably compensate for the output fluctuation due to noise, temperature variation, deterioration with time, or the like.

(Eighth Embodiment)

Figure 12:
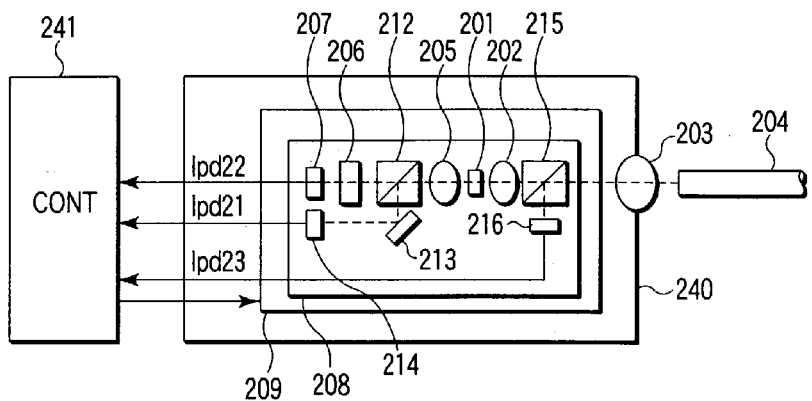
FIG. 12 is a view showing the internal structure of a CW laser transmitter device (module) according to an eighth embodiment of the present invention.

FIG. 12 is a view showing the internal structure of a CW laser transmitter device (module) according to an eighth embodiment of the present invention. This device 240 includes three monitor PDs 207, 214, and 216 for the same purposes as those in the device shown in FIG. 11. However, a beam splitter 215 divides light emitted forward from a DFB laser 201, and one of the light outputs thus divided is incident on the monitor PD 216. In other words, means for extracting the monitor output can be disposed to either light emitted forward or light emitted backward from the DFB laser 201. A controller (such as an MPU for control) 241 performs a wavelength control operation in the same manner as the controller 231 according to the seventh embodiment.

(Matters Common to Fifth to Eighth Embodiments)

In the fifth to eighth embodiments, conversely to the explanation in these embodiments, the reflector 213 may have a characteristic such that the light reflectivity shows a monotone decrease with the increase in wavelength over the predetermined wavelength range (i.e., no extreme value in the range). Similarly, the relationship between the light transmissivity and light reflectivity of the optical element 223 may be converse to the embodiment within the predetermined wavelength range. The predetermined wavelength range denotes a range over a plurality of channels in DWDM optical communication, for example, a range entirely over the wavelengths (such as channels ch1 to ch4) that the DFB laser 101 is assigned to.

(Ninth Embodiment)

Figure 13:
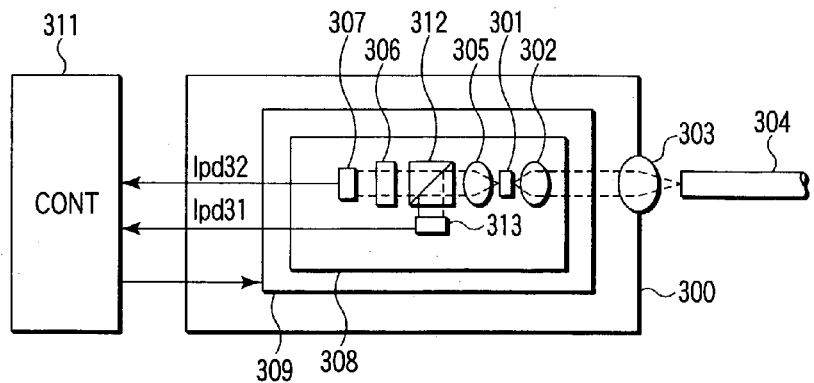
FIG. 13 is a view showing the internal structure of a CW laser transmitter device (module) according to a ninth embodiment of the present invention.

FIG. 13 is a view showing the internal structure of a CW laser transmitter device (module) according to a ninth embodiment of the present invention. This device 300 includes a DFB semiconductor laser (light source) 301, an FP filter 306, a monitor PD 307 having an InGaAs light absorption layer, a monitor PD 313 having an InGaAsP light absorption layer, a beam splitter 312, and so forth. These members are mounted, through a carrier 308, on a Peltier element 309 for temperature control. Light emitted forward from the DFB laser 301 focuses on an optical fiber 304 through lenses 302 and 303.

Light emitted backward from the DFB laser 301 in the reverse direction relative to the optical fiber 304 passes through a lens 305 and is divided into two parts by the beam splitter 312. One of the light outputs divided by the beam splitter 312 passes through the FP filter 306 and is incident on the InGaAs monitor PD 307. The other of the light outputs divided by the beam splitter 312 is incident on the InGaAsP monitor PD 313. The FP filter 306 is designed to have an FSR equal to the channel intervals in DWDM optical communication. Specifically, the light transmissivity of the filter 306 changes in a cycle corresponding to the channel intervals.

The InGaAsP monitor PD 313 is designed to have a characteristic such that the optical sensitivity shows a monotone decrease with the increase in wavelength (having no extreme value in the range) within a range over a plurality of channels in DWDM optical communication, for example, a range entirely over the wavelengths (such as channels ch1 to ch4) that the DFB laser 301 is assigned to in DWDM optical communication. On the other hand, the InGaAs monitor PD 307 is designed to have optical sensitivity almost constant over the predetermined wavelength range described above. More specifically, in the embodiment, the InGaAsP monitor PD 313 has a light absorption layer with a band gap wavelength of 1.60 μm, and the optical sensitivity decreases with the increase in wavelength within the C-band waveband (1.53 to 1.56 μm). On the other hand, the InGaAs monitor PD 307 has optical sensitivity almost constant within the C-band waveband. Since the monitor PD 307 is only required to have optical sensitivity with almost no wavelength dependency, various kind of monitor PDs may be used as the monitor PD 307.

Figure 14:
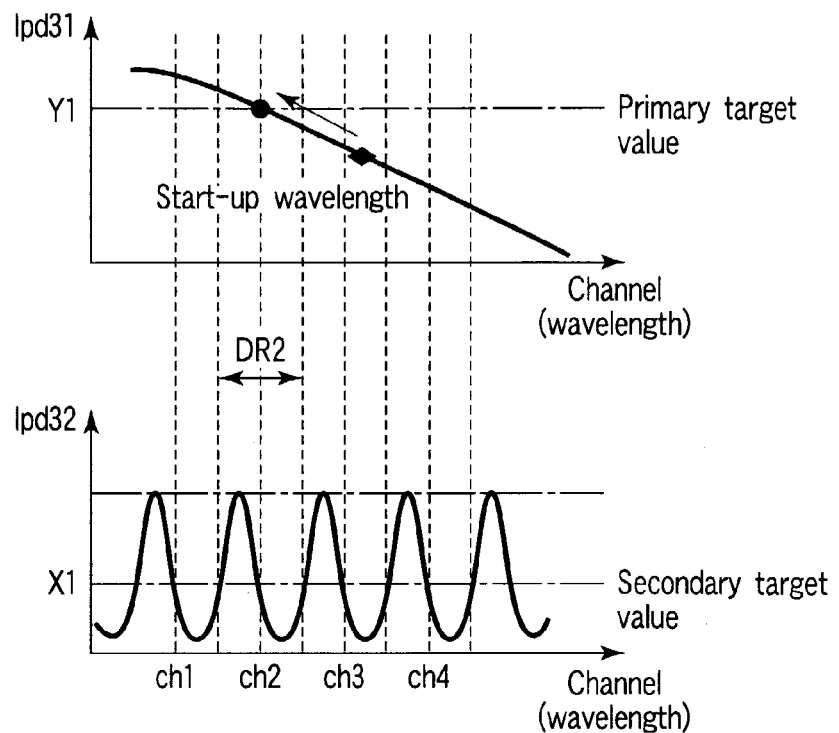
FIG. 14 is a graph showing the wavelength dependency of the output currents of monitor PDs in the ninth embodiment.

FIG. 14 is a graph showing the wavelength dependency of the output currents Ipd31 and Ipd32 of InGaAsP monitor PD 313 and InGaAs monitor PD 307 in the ninth embodiment. In FIG. 14, the horizontal axis denotes the DFB laser oscillation wavelength, and the vertical axis denotes the monitor output current. The output current Ipd31 from the InGaAsP monitor PD 313 shows wavelength dependency including a monotone decrease over a plurality of channels, because it reflects the wavelength dependency of the optical sensitivity of the monitor PD 313. On the other hand, the output current Ipd32 from the InGaAs monitor PD 307 reflects only the transmission characteristic of the FP filter 306, because the optical sensitivity of the monitor PD 307 is almost constant. As a consequence, the output current Ipd32 periodically changes with the wavelength in the same cycle as the channel intervals.

For example, when the oscillation wavelength of the DFB laser 301 is tuned to channel ch2, the controller (such as an MPU for control) 311 performs a wavelength control operation, as follows. Specifically, when the DFB laser 301 starts up, the temperature of the DFB laser 301 is first adjusted by the Peltier element 309, so that the value of the monitor output current Ipd31 comes close to a primary target value Y1. Then, the temperature of the DFB laser 301 is accurately controlled by the Peltier element 309, so that the value of the monitor output current Ipd32 takes on a secondary target value X1.

In summary, the oscillation wavelength of the DFB laser 301 is first adjusted (a first stage adjustment) into the wavelength capture range of a predetermined channel (such as the wavelength capture range DR2 of channel ch2) on the basis of the monitor output current Ipd31, and then is accurately tuned (a second stage adjustment) to the predetermined channel on the basis of the monitor output current Ipd32. As a consequence, the oscillation wavelength of the DFB laser 301 is accurately controlled to be a desired channel wavelength, without reference to the start-up oscillation wavelength.

For the sake of easy understanding, FIG. 13 shows no automatic output control system for the DFB laser 301, which comprises the monitor PD 34, controller 36, and so forth in FIG. 32. However, the device 300 shown in FIG. 13 also includes such an automatic output control system, which adjusts the current fed to the DFB laser 301, so that the light output of the DFB laser 301 is controlled to be constant.

(Tenth Embodiment)

Figure 15:
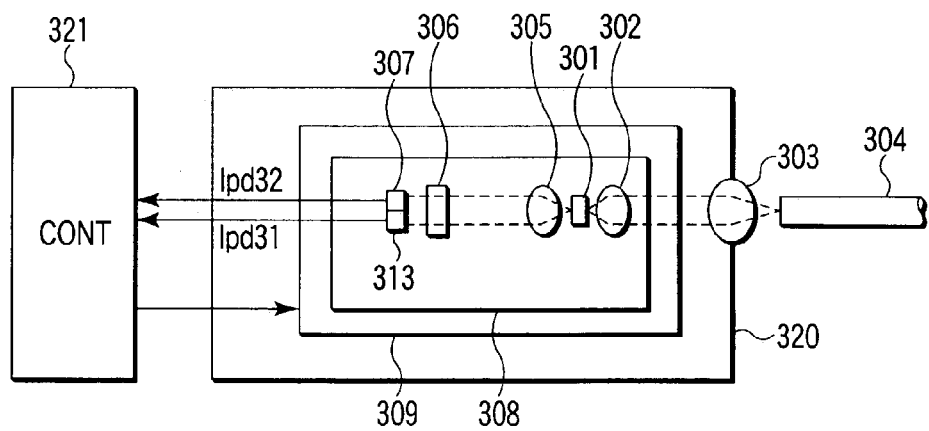
FIG. 15 is a view showing the internal structure of a CW laser transmitter device (module) according to a tenth embodiment of the present invention.

FIG. 15 is a view showing the internal structure of a CW laser transmitter device (module) according to a tenth embodiment of the present invention. In this device 320, the beam splitter 312 is excluded, and an InGaAs monitor PD 307 and an InGaAsP monitor PD 313 are juxtaposed. Since the two monitor PDs 307 and 313 are adjacent to each other and use similar materials, they may be integrated and monolithic on a single substrate. The other members are arranged in the same manner as in the device 300 shown in FIG. 13. Light emitted backward from the DFB laser 301 in the reverse direction relative to an optical fiber 304 passes through the FP filter 306 and is incident on the two monitor PDs 307 and 313 at the same time.

Figure 16:
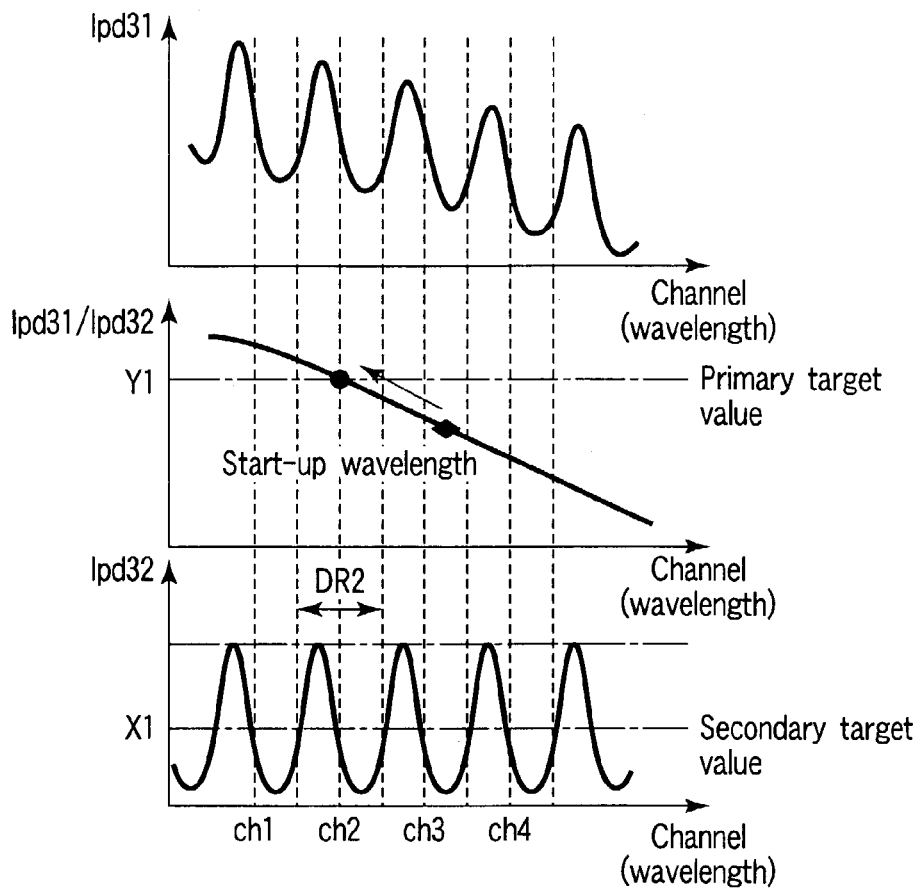
FIG. 16 is a graph showing the wavelength dependency of the output currents of monitor PDs in the tenth embodiment.

FIG. 16 is a graph showing the wavelength dependency of the output currents Ipd31 and Ipd32 of the InGaAsP monitor PD 313 and InGaAs monitor PD 307 in the tenth embodiment. In FIG. 16, the horizontal axis denotes the DFB laser oscillation wavelength, and the vertical axis denotes the monitor output current or a normalized monitor output. The output current Ipd32 from the InGaAs monitor PD 307 reflects only the transmission characteristic of the FP filter 306, because the optical sensitivity of the monitor PD 307 is almost constant. As a consequence, the output current Ipd32 periodically changes with the wavelength in the same cycle as the channel intervals. On the other hand, the output current Ipd31 from the InGaAsP monitor PD 313 reflects both the wavelength dependency of the optical sensitivity of the monitor PD 313 and the transmission characteristic of the FP filter 306. As a consequence, the output current Ipd31 shows wavelength dependency such that it changes in the same cycle as the channel intervals while it decreases along with the cyclic (periodic) change with the increase in wavelength. However, in a controller (such as an MPU for control) 321, the Ipd31 is then normalized with the Ipd32 to calculate a value (Ipd31/Ipd32), thereby extracting a monitor output, which only shows the wavelength dependency of the optical sensitivity of the InGaAsP monitor PD 313 (due to the light absorption layer).

For example, when the oscillation wavelength of the DFB laser 301 is tuned to channel ch2, the controller 321 performs a wavelength control operation, as follows. Specifically, when the DFB laser 301 starts up, the temperature of the DFB laser 301 is first adjusted by the Peltier element 309, so that the value of the a normalized monitor output Ipd31/Ipd32 comes close to a primary target value Y1. Then, the temperature of the DFB laser 301 is accurately controlled by the Peltier element 309, so that the value of the monitor output current Ipd32 takes on a secondary target value X1.

In summary, the oscillation wavelength of the DFB laser 301 is first adjusted (a first stage adjustment) into the wavelength capture range of a predetermined channel (such as the wavelength capture range DR2 of channel ch2) on the basis of the normalized monitor output Ipd31/Ipd32, and then is accurately tuned (a second stage adjustment) to the predetermined channel on the basis of the monitor output current Ipd32. As a consequence, the oscillation wavelength of the DFB laser 301 is accurately controlled to be a desired channel wavelength, without reference to the start-up oscillation wavelength.

According to the tenth embodiment, since the first stage adjustment is performed on the basis of the normalized monitor output Ipd31/Ipd32, it is possible to compensate for the output fluctuation due to noise, temperature variation, deterioration with time, or the like.

(Eleventh Embodiment)

Figure 17:
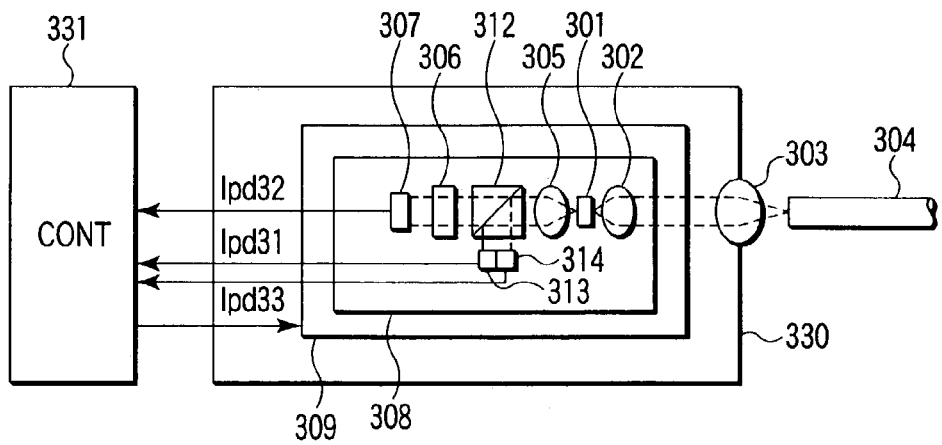
FIG. 17 is a view showing the internal structure of a CW laser transmitter device (module) according to an eleventh embodiment of the present invention.

FIG. 17 is a view showing the internal structure of a CW laser transmitter device (module) according to an eleventh embodiment of the present invention. In this device 330, an InGaAs monitor PD 314, which is a third monitor PD, is juxtaposed to an InGaAsP monitor PD 313. Since the two monitor PDs 313 and 314 are adjacent to each other and use similar materials, they may be integrated and monolithic on a single substrate. One of the light outputs divided by a beam splitter 312 and not passing through an FP filter 306 is directly incident on the two monitor PDs 313 and 314 at the same time. The InGaAs monitor PD 314 is designed to have optical sensitivity almost constant within the C-band waveband. Specifically, the monitor PD 314 presents an output with a current value Ipd33 in accordance with the light intensity itself of a DFB laser 301. The other members are arranged in the same manner as in the device 300 shown in FIG. 13.

In a practical laser transmitter device, when the temperature of a laser is changed, not only the oscillation wavelength but also the light intensity changes. Furthermore, light intensity fluctuation is caused by variation with time. In order to remove the influence of this light intensity fluctuation, a controller (such as an MPU for control) 331 performs a wavelength control operation, while using monitor outputs obtained by normalizing the output currents Ipd31 and Ipd32 from the InGaAsP monitor PDs 313 and 307 with the output current Ipd33 from the monitor PD 314. Specifically, the oscillation wavelength of the DFB laser 301 is first adjusted (a first stage adjustment) into the wavelength capture range of a predetermined channel on the basis of a normalized monitor output Ipd31/Ipd33, and then is accurately tuned (a second stage adjustment) to the predetermined channel on the basis of a normalized monitor output Ipd32/Ipd33.

The output current Ipd33 from the monitor PD 314 can be used as a detection signal in an automatic output control system for the DFB laser 301. In this case, the current fed to the DFB laser 301 can be controlled to keep the output current Ipd33 constant by a suitable output control circuit (APC).

According to the eleventh embodiment, the first stage and second stage adjustments are performed on the basis of the normalized monitor outputs Ipd31/Ipd33 and Ipd32/Ipd33, it is possible to reliably compensate for the output fluctuation due to noise, temperature variation, deterioration with time, or the like.

(Twelfth Embodiment)

Figure 18:
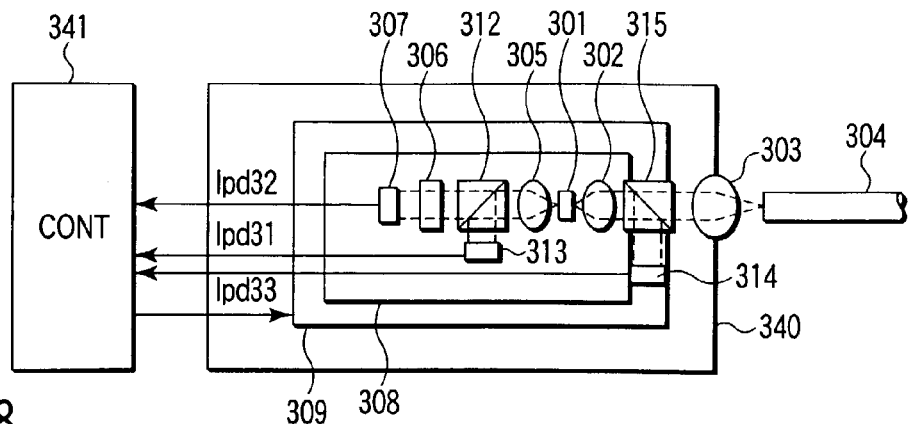
FIG. 18 is a view showing the internal structure of a CW laser transmitter device (module) according to a twelfth embodiment of the present invention.

FIG. 18 is a view showing the internal structure of a CW laser transmitter device (module) according to a twelfth embodiment of the present invention. This device 340 includes three monitor PDs 307, 313, and 314 for the same purposes as those in the device shown in FIG. 17. However, a beam splitter 315 divides light emitted forward from a DFB laser 301, and one of the light outputs thus divided is incident on the monitor PD 314. In other words, means for extracting the monitor output can be disposed to either light emitted forward or light emitted backward from the DFB laser 301. A controller (such as an MPU for control) 341 performs a wavelength control operation in the same manner as the controller 331 according to the eleventh embodiment.

(Matters Common to Ninth to Twelfth Embodiments)

In the ninth to twelfth embodiments, conversely to the explanation in these embodiments, the monitor PD 313 may have a characteristic, by choosing suitable materials, such that the optical sensitivity shows a monotone increase with the increase in wavelength over the predetermined wavelength range (i.e., no extreme value in the range). The predetermined wavelength range denotes a range over a plurality of channels in DWDM optical communication, for example, a range entirely over the wavelengths (such as channels ch1 to ch4) that the DFB laser 301 is assigned to.

(Thirteenth Embodiment)

Figure 19:
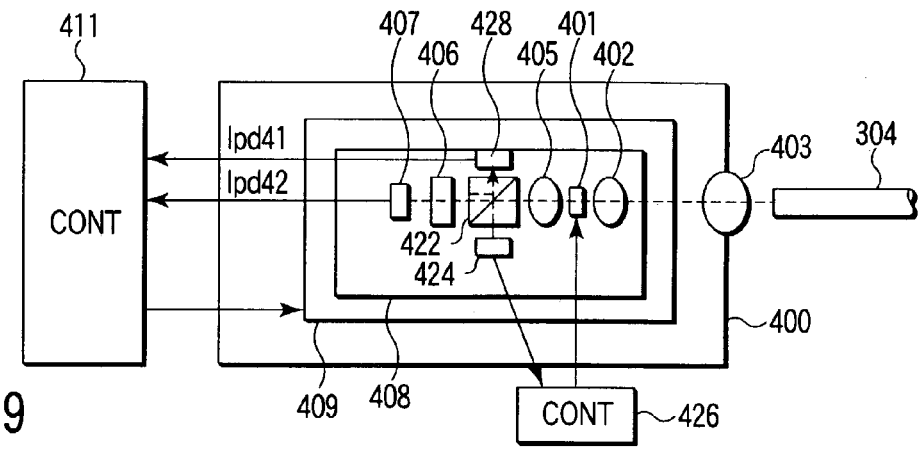
FIG. 19 is a view showing the internal structure of a CW laser transmitter device (module) according to a thirteenth embodiment of the present invention.

FIG. 19 is a view showing the internal structure of a CW laser transmitter device (module) according to a thirteenth embodiment of the present invention. This device 400 includes a DFB semiconductor laser (light source) 401, an FP filter (such as etalon) 406, monitor PDs 407, 424, and 428, and so forth. These members are mounted, through a carrier 408, on a Peltier element 409 for temperature control. Light emitted forward from the DFB laser 401 focuses on an optical fiber 404 through lenses 402 and 403.

Light emitted backward from the DFB laser 401 in the reverse direction relative to the optical fiber 404 passes through a lens 405 and is divided into two parts by the beam splitter 422. One of the light outputs divided by the beam splitter 422 passes through the FP filter 406 and is incident on the monitor PD 407, which outputs a current in accordance with a reception light intensity. The other of the light outputs divided by the beam splitter 422 is directly incident on the monitor PD 424. Furthermore, a part of said one of the light outputs divided by the beam splitter 422 does not pass through the FP filter 406, but is reflected thereby. This reflected light is further reflected by the beam splitter 422 and is incident on the monitor PD 428.

For example, the DFB laser (wavelength-tunable laser) 401 is assigned to 4 channels ch1 to ch4 with wavelength intervals of 100 GHz (about 0.8 nm) based on an ITU-T recommendation. The DFB laser 401 oscillates light with a wavelength corresponding to each one of 4 channels, while its temperature being controlled by the Peltier element 409.

The output currents of the monitor PDs 407 and 428 are used by a controller (wavelength lock control circuit (AFC)) 411 to adjust the temperature of the Peltier element 409, so as to control the oscillation wavelength of the DFB laser 401 to be constant. On the other hand, the output current of the monitor PD 424 is used by a controller (output control circuit (APC)) 426 to adjust the current fed to the DFB laser 401, so as to control the light output of the DFB laser 401 to be constant. Each of the controllers 411 and 426 is formed of, e.g., an MPU (Microprocessor Unit) for control.

Figure 20:
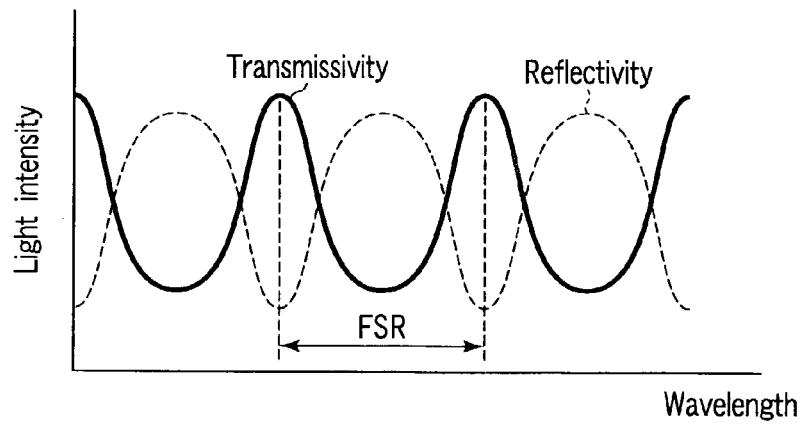
FIG. 20 is a graph showing the light intensities of transmitted light and reflected light by an FP filter according to the tenth embodiment.

The FP filter 406 has a transmission characteristic with wavelength dependency, whose FSR is designed equal to the channel intervals in DWDM optical communication. Accordingly, the FP filter 406 also has a reflection characteristic with wavelength dependency. Specifically, the light transmissivity and light reflectivity of the filter 406 change in a cycle corresponding to the channel intervals. FIG. 20 is a graph showing the light intensities of transmitted light and reflected light by the FP filter 406. In FIG. 20, the horizontal axis denotes the DFB laser oscillation wavelength, and the vertical axis denotes the light intensity. As shown in FIG. 20, the intensities of the transmitted light and reflected light by FP filter 406 are inverted relative to each other.

The monitor PD 428 is designed to have a characteristic such that the optical sensitivity shows a monotone decrease with the increase in wavelength (having no extreme value in the range) within a range over a plurality of channels in DWDM optical communication, for example, a range entirely over the wavelengths (such as channels ch1 to ch4) that the DFB laser 401 is assigned to in DWDM optical communication. An InGaAsP monitor PD as described in the ninth embodiment may be used as the monitor PD 428. On the other hand, the monitor PDs 407 and 424 are designed to have optical sensitivity almost constant over the predetermined wavelength range described above. An InGaAs monitor PD as described in the ninth embodiment may be used as each of the monitor PDs 407 and 424.

Figure 21:
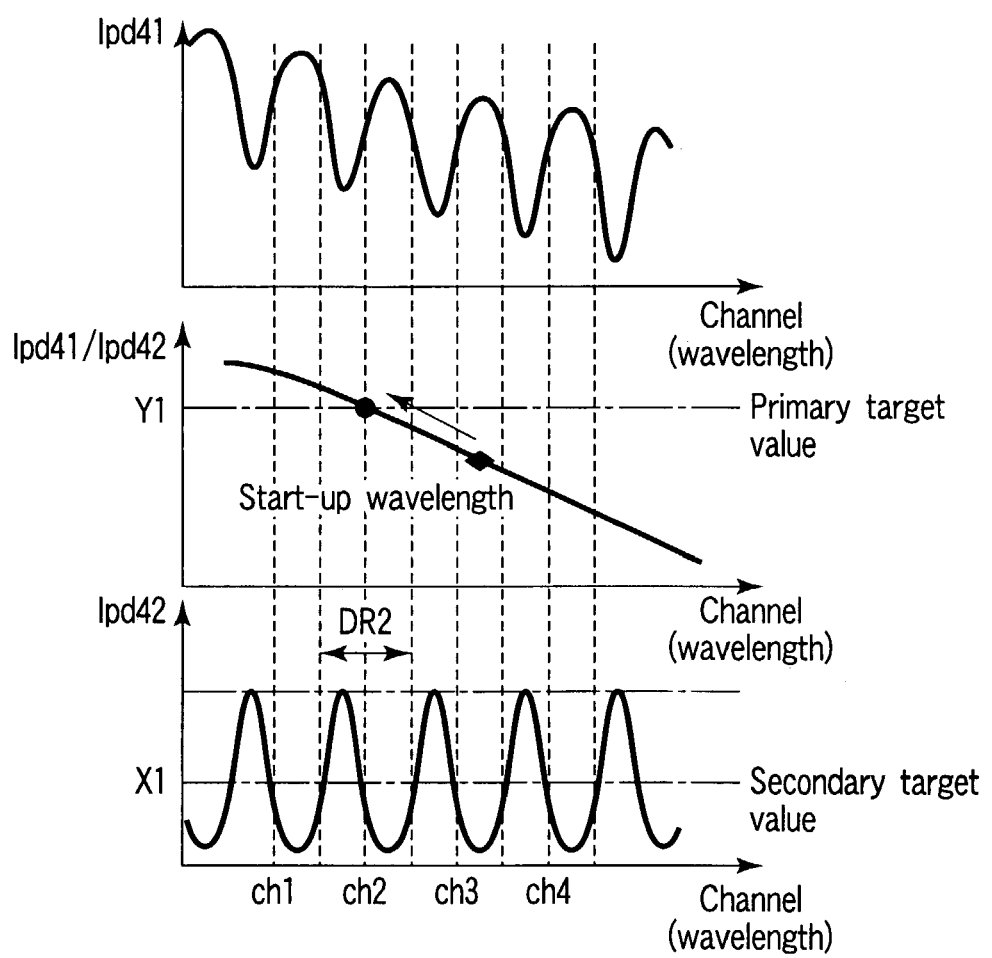
FIG. 21 is a graph showing the wavelength dependency of the output currents of monitor PDs in the thirteenth embodiment.

FIG. 21 is a graph showing the wavelength dependency of the output currents Ipd41 and Ipd42 of the monitor PDs 428 and 407 in the thirteenth embodiment. In FIG. 21, the horizontal axis denotes the DFB laser oscillation wavelength, and the vertical axis denotes the monitor output current or a normalized monitor output. The output current Ipd42 from the monitor PD 407 reflects only the transmission characteristic of the FP filter 406, because the optical sensitivity of the monitor PD 407 is almost constant. As a consequence, the output current Ipd42 periodically changes with the wavelength in the same cycle as the channel intervals. On the other hand, the output current Ipd41 from the monitor PD 428 reflects both the wavelength dependency of the optical sensitivity of the monitor PD 428 and the reflection characteristic of the FP filter 406. As a consequence, the output current Ipd41 shows wavelength dependency such that it changes in the same cycle as the channel intervals and in an inverted state relative to the output current Ipd42 while it decreases along with the cyclic (periodic) change with the increase in wavelength.

However, in a controller (such as an MPU for control) 411, the Ipd41 is then normalized with the Ipd42, thereby extracting a monitor output, which only shows the wavelength dependency of the optical sensitivity of the monitor PD 428. More specifically, the output current Ipd41 is in an inverted state relative to the output current Ipd42, a signal Ipd42R obtained by inverting the Ipd42 is used as a denominator for normalizing the Ipd41. Then, Ipd41/Ipd42R is calculated as a normalized monitor output.

For example, when the oscillation wavelength of the DFB laser 401 is tuned to channel ch2, the controller 411 performs a wavelength control operation, as follows. Specifically, when the DFB laser 401 starts up, the temperature of the DFB laser 401 is first adjusted by the Peltier element 409, so that the value of the normalized monitor output Ipd41/Ipd42R comes close to a primary target value Y1. Then, the temperature of the DFB laser 401 is accurately controlled by the Peltier element 409, so that the value of the monitor output current Ipd42 takes on a secondary target value X1.

In summary, the oscillation wavelength of the DFB laser 401 is first adjusted (a first stage adjustment) into the wavelength capture range of a predetermined channel (such as the wavelength capture range DR2 of channel ch2) on the basis of the normalized monitor output Ipd41/Ipd42R, and then is accurately tuned (a second stage adjustment) to the predetermined channel on the basis of the monitor output current Ipd42. As a consequence, the oscillation wavelength of the DFB laser 401 is accurately controlled to be a desired channel wavelength, without reference to the start-up oscillation wavelength.

Furthermore, after the second stage adjustment, the wavelength dependency shift amount of the FP filter (such as etalon) 406 can be monitored by referring to the Ipd41/Ipd42R again. If the shift amount exceeds a certain value, performing only the first stage adjustment provides more accurate control.

In FIG. 19, all the DFB laser 401, FP filter 406, monitor PDs 407, 424, and 428 are mounted on the Peltier element 409 to prevent the transmission characteristic of the filter 406 relative to the wavelength from shifting with the temperature. However, according to this embodiment, if only the laser 401 that requires temperature control is disposed on the Peltier element 409, wavelength lock control can be accurately performed, thereby reducing the driving load of the Peltier element 409.

(Matters Common to First to Thirteenth Embodiments)

In the first to thirteenth embodiments, the filters 106, 206, 306, and 406 may be designed to have an FSR equal to two times the channel intervals in DWDM optical communication. In this case, the wavelength capture range of each channel can be two times the channel intervals. However, as describe previously, the increase and decrease in a control parameter for the oscillation wavelength (such as temperature) has to be controlled in reverse to each other between the even-numbered channels and odd-numbered channels, in the second stage adjustment.

In each of the embodiments, the controller (such as the controller 111) for wavelength control may be formed of an MPU (Microprocessor Unit) for control. In this case, the MPU for control to be used is preset to execute a method of controlling the laser wavelength, as described in each of the embodiments, i.e., a step of receiving outputs (electric signals) from the respective monitor PDs, a step of generating and outputting a signal for performing the first stage adjustment, and a step of generating and outputting a signal for performing the second stage adjustment. In other words, the MPU for control to be used is designed to have, at least, means for receiving outputs (electric signals) from the respective monitor PDs, means for generating and outputting a signal for performing the first stage adjustment, and means for generating and outputting a signal for performing the second stage adjustment.

In each of the embodiments, the laser transmitter device (such as the device 100) is shown as a module of the so-called discrete type, which has no controller (such as the controller 111) built therein. However, the laser transmitter device (such as the device 100) may be formed of a module of the so-called complete type, which has a controller (such as the controller 111) built therein. On the other hand, the wavelength monitor function and light intensity monitor function for the laser transmitter device are not necessarily all built within the device, but partly disposed outside. The arrangement of the members in the laser transmitter device is not limited to any one of the embodiments, but is modified to have one of the various layouts.

In each of the embodiments, the light source is formed of a DFB laser, but it may be formed of a different type, such as a DBR (Distributed Bragg Reflector) laser, a light modulator integrated laser of the electric field absorption type, a multi-electrode DFB laser, or the like. Where the light source is formed of a DFB laser, the oscillation wavelength is controlled by a controller, using as a control signal a driving current to a Peltier element, which changes the laser temperature. On the other hand, where the light source is formed of a DBR laser, the oscillation wavelength is controlled by a controller, using as a control signal a driving current to the DBR laser.

(Fourteenth Embodiment)

FIG. 22 is a block diagram showing a laser transmitter device according to a fourteenth embodiment of the present invention. Light emitted from a wavelength-tunable laser (light source) 511 is divided by a light-dividing element 512. A part of the light divided by the light-dividing element 512 is used as monitor light for stabilizing the emitted light wavelength at a predetermined wavelength. The rest of the light divided by the light-dividing element 512 is used as output light locked at a predetermined wavelength. The treatment that light emitted from the laser 511 is divided by the light-dividing element 512 is substantially equivalent to the treatment that output light is taken from one side of the laser while monitor light is extracted from the other side of the laser, as described in the first embodiment.

A part of the light divided by the first light-dividing element 512 passes through a first filter 513 and is further divided into two parts by a second light-dividing element 514. A part of the light divided by the second light-dividing element 514 is incident on a first detection element 515, which detects light intensity. The other part of the light divided by the second light-dividing element 514 passes through a second filter 516 and is incident on a second detection element 517. The first filter 513 is designed to have light transmissivity expressed by a characteristic line with a slant portion extending over a plurality of channels in DWDM optical communication. On the other hand, the second filter 516 is designed to have an FSR equal to the channel intervals in DWDM optical communication, or equal to two times the channel intervals. Specifically, the light transmissivity of the second filter 516 changes in a cycle corresponding to the channel intervals or two times the channel intervals.

A controller 518 controls the wavelength of the wavelength-tunable laser 511, on the basis of first and second detection values, which are outputs from the first and second detection elements 515 and 517, respectively. Where the laser 511 is formed of a DBR laser, the control signal of the controller 518 is a driving current to the DBR laser. Where the laser 511 is formed of a DFB laser, the control signal of the controller 518 is a driving current to a Peltier element or the like, which changes the laser temperature.

By the controller 518, the oscillation wavelength of the wavelength-tunable laser 511 is first adjusted (a first stage adjustment) into the wavelength capture range of a predetermined channel on the basis of the first detection value, and then is accurately tuned (a second stage adjustment) to the predetermined channel on the basis of the a monitor output (the second detection value/the first detection value) obtained by normalizing the second detection value with the first detection value. As a consequence, the oscillation wavelength of the wavelength-tunable laser 511 is accurately controlled to be a desired channel wavelength, without reference to the start-up oscillation wavelength. Furthermore, since the second stage adjustment is performed on the basis of the normalized monitor output (the second detection value/the first detection value), it is possible to compensate for the output fluctuation due to noise, temperature variation, deterioration with time, or the like.

(Fifteenth Embodiment)

FIG. 23 is a block diagram showing a laser transmitter device according to a fifteenth embodiment of the present invention. This embodiment relates to a concrete example of the fourteenth embodiment shown in FIG. 22. This device includes a wavelength-tunable laser 521 formed of a DBR semiconductor laser, which can emit laser light with a plurality of wavelengths by increasing or decreasing the driving current. In the embodiment, the wavelength-tunable laser 521 outputs single mode laser light corresponding to each one of 8 channels in DWDM optical communication.

Light emitted from the wavelength-tunable laser 521 is divided by a coupler 522. A part of the light divided by the coupler 522 is used as monitor light for stabilizing the emitted light wavelength at a predetermined wavelength. The rest of the light divided by the coupler 522 is used as output light locked at a predetermined wavelength. A part of the light divided by the coupler 522 passes through a thin-film filter 523 and is further divided into two parts by a beam splitter 524. A part of the light divided by the beam splitter 524 is incident on a first PD 525, which detects light intensity. The other part of the light divided by the beam splitter 524 passes through an FP filter 526 and is incident on a second PD 527. The first and second PDs 525 and 527 present output currents Ipd51 and Ipd52, respectively.

The thin-film filter 523 is formed of a low pass filter or band pass filter, which is designed to have light transmissivity expressed by a characteristic line with a slant portion extending over a plurality of channels in DWDM optical communication. More specifically, thin-film filter 523 has a characteristic such that the light transmissivity shows a monotone increase with the increase in wavelength (having no extreme value in the range) entirely over the wavelength range of channels ch0 to ch7 that the wavelength-tunable laser 521 is assigned to in DWDM optical communication. On the other hand, the FP filter 526 is designed to have an FSR equal to two times the channel intervals in DWDM optical communication. Specifically, the light transmissivity of the FP filter 526 changes in a cycle corresponding to two times the channel intervals. For example, where the wavelength intervals between the channels ch are 50 GHz based on an ITU-T recommendation, the FSR of the FP filter 526 is preset to be 100 GHz. Furthermore, the FP filter 526 has finesse in that the relationship between the wavelength and light transmissivity agrees with the channels in DWDM optical communication.

FIG. 24 is a graph showing the wavelength dependency of the output current Ipd51 of the first PD 525 and a monitor output Ipd52/Ipd51 obtained by normalizing the output current Ipd52 of the second PD 527 with the Ipd51 in the fifteenth embodiment. In FIG. 24, the horizontal axis denotes the DFB laser oscillation wavelength, and the vertical axis denotes the monitor output current or normalized monitor output. The output current Ipd51 from the first PD 525 shows wavelength dependency including a monotone increase over a plurality of channels, because it reflects the transmission characteristic of the filter 523.

On the other hand, the output current Ipd52 from the second PD 527 reflects both the transmission characteristics of the filters 523 and 526, because the second PD 527 receives light having passed through both the filters 523 and 526. As a consequence, the output current Ipd52 shows wavelength dependency such that it changes in the same cycle as the channel intervals while it increases along with the cyclic (periodic) change with the increase in wavelength. However, the Ipd52 is then normalized with the Ipd51 to calculate a value (Ipd52/Ipd51), thereby extracting a monitor output, which only shows the transmission characteristic of the filter 526. In FIG. 24, ranges DR3 and DR4 denote the wavelength capture ranges of channels ch3 and ch4, respectively.

The output currents Ipd51 and Ipd52 from the first and second PDs 525 and 527 are inputted into an MPU (Microprocessor Unit) 532 for control through amplifiers 528 and 529, and analog-to-digital converters (A/D) 530 and 531. The MPU 532 processes the input signal, as described later, to output, through a digital-to-analog converter (D/A) 533, a control signal for adjusting the oscillation wavelength of the wavelength-tunable laser 521. With this control signal, the temperature and driving current of the wavelength-tunable laser 521 are adjusted, to lock the oscillation wavelength of the wavelength-tunable laser 521 at a predetermined channel wavelength.

In the memory section of the MPU 532, such a table is stored that shows the relationship of the wavelengths of channels ch0 to ch7, relative to target values of the output current Ipd51 (e.g., the primary target value Y1 shown in FIG. 24) and target values of the normalized monitor output Ipd52/Ipd51 (e.g., the secondary target value X1 shown in FIG. 24), for the respective channel wavelengths. This table is formed by actually measuring, in advance, outputs of the first and second PDs 525 and 527 obtained at the respective channel wavelengths.

Figure 25:
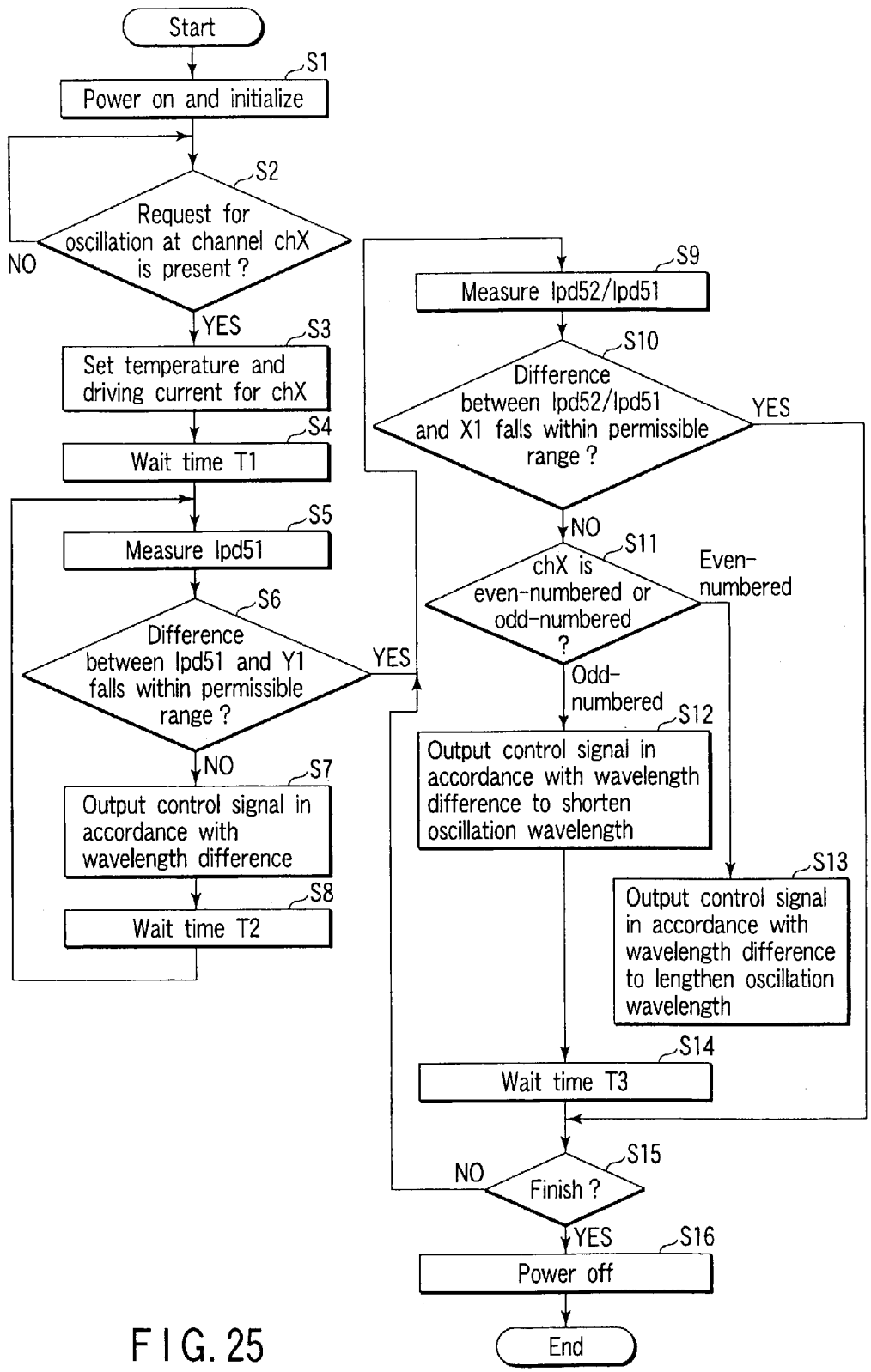
FIG. 25 is a flowchart showing a control method of stabilizing the wavelength in the laser transmitter device according to the fifteenth embodiment.

FIG. 25 is a flowchart showing a control method of stabilizing the wavelength in the laser transmitter device according to the fifteenth embodiment. An explanation will be given of this control method with reference to FIGS. 23 to 25.

First, a system control circuit (not shown) for controlling the DWDM optical communication system turns on the power supply for the MPU 532. Upon the power supply being turned on, a program stored in the MPU 532 starts, and then turns on the power supply for the wavelength-tunable laser 521 and initializes the circuit for stabilizing the wavelength (step S1). Then, MPU 532 judges whether there is a request for the wavelength-tunable laser 521 to oscillate for a channel (step S2). Where there is no request, this step is repeated until a request is made.

Where there is a request in relation to a predetermined channel, e.g., oscillation at channel ch3, the MPU 532 sets the temperature and driving current of the wavelength-tunable laser 521 to correspond to channel ch3, and transmit a control signal to the wavelength-tunable laser 521 (step S3). With this control signal, the wavelength-tunable laser 521 starts oscillation at a start-up wavelength.

The MPU 532 stops the process from step S5 for a period of time T1 (several seconds) to wait until the laser oscillation of the wavelength-tunable laser 521 stabilizes (step S4). The first PD 525 receives light, which has been emitted from the wavelength-tunable laser 521 and passed through the thin-film filter 523, and outputs a current Ipd51 to the MPU 532 in accordance with the reception light intensity. The MPU 532 measures this current value (step S5).

The MPU 532 subtracts the output current Ipd51 from a primary target value Y1 corresponding to channel ch3 and stored in the memory section, to calculate the difference between the output current Ipd51 and primary target value Y1, and judges whether this calculated value falls within a permissible range or not (step S6). Calculation of the difference between the output current Ipd51 and primary target value Y1 corresponds to calculation of the difference between the present oscillation wavelength of the wavelength-tunable laser 521 and the predetermined wavelength.

If the calculated value (wavelength difference) falls within the permissible range in the judgment, the MPU 532 performs step S9 described later. On the other hand, if the calculated value (wavelength difference) does not fall within the permissible range in the judgment, the MPU 532 outputs a control signal in accordance with the calculated difference (step S7). In this case, where the calculated value is minus, it means that the present oscillation wavelength is longer than the predetermined wavelength, and thus the output control signal is set to increase the driving current so as to shorten the oscillation wavelength. Where the calculated value is plus, it means that the present oscillation wavelength is shorter than the predetermined wavelength, and thus the output control signal is set to decrease the driving current so as to lengthen the oscillation wavelength.

The MPU 532 stops the process for a period of time T2 (several seconds) to wait until the laser oscillation of the wavelength-tunable laser 521 stabilizes (step S8). After the time T2, the MPU 532 returns the process to step S5, and repeats steps S5 to S8 until the calculated value falls within the permissible range. By repeating these steps, the oscillation wavelength of the wavelength-tunable laser 521 is adjusted so that the start-up wavelength is made to fall within the wavelength capture range of channel ch3.

On the other hand, the second PD 527 receives light, which has been emitted from the wavelength-tunable laser 521 and passed through the thin-film filter 523 and FP filter 526, and outputs a current Ipd52 to the MPU 532 in accordance with the reception light intensity. On the basis of this output, the MPU 532 calculates a monitor output Ipd52/Ipd51 by normalizing the output current Ipd52 from the second PD 527 with the output current Ipd51 from the first PD 525 (step S9).

The MPU 532 subtracts the normalized monitor output Ipd52/Ipd51 from a secondary target value X1 to calculate the difference between the normalized monitor output Ipd52/Ipd51 and secondary target value X1 for channel ch3, and judges whether this calculated value falls within a permissible range or not (step S10). If the calculated value (wavelength difference) falls within the permissible range in the judgment, the MPU 532 performs step S15 described later. On the other hand, if the calculated value (wavelength difference) does not fall within the permissible range in the judgment, the MPU 532 further judges whether the channel designated by the system control circuit described above is an even-numbered channel or odd-numbered channel (step S11). This is so, because, even if calculated values are the same in sign, the control signal is differently set between the even-numbered channel and odd-numbered channel, in terms of the increase and decrease in parameter.

Where it is an odd-numbered channel in the judgment, the MPU 532 outputs a control signal in accordance with the calculated value (wavelength difference) for the odd-numbered channel (step S12). In the case of an odd-numbered channel, within its wavelength capture range (see the wavelength capture range DR3 of channel ch3 shown in FIG. 24), the Ipd52/Ipd51 is larger than the secondary target value X1 at a wavelength longer than the channel wavelength, and is smaller than the secondary target value X1 at a wavelength shorter than the channel wavelength. Accordingly, in this case, where the calculated value is minus, it means that the present oscillation wavelength is longer than the predetermined wavelength, and thus the output control signal is set to increase the driving current so as to shorten the oscillation wavelength. Where the calculated value is plus, it means that the present oscillation wavelength is shorter than the predetermined wavelength, and thus the output control signal is set to decrease the driving current so as to lengthen the oscillation wavelength. In this example, the predetermined channel is channel ch3, the process is performed in accordance with step S12.

On the other hand, where it is an even-numbered channel in the judgment, the MPU 532 outputs a control signal in accordance with the calculated value (wavelength difference) for the even-numbered channel (step S13). In the case of an even-numbered channel, within its wavelength capture range (see the wavelength capture range DR4 of channel ch4 shown in FIG. 24), the Ipd52/Ipd51 is smaller than the secondary target value X1 at a wavelength longer than the channel wavelength, and is larger than the secondary target value X1 at a wavelength shorter than the channel wavelength. Accordingly, in the case of an even-numbered channel, the output control signal is set in reverse to the case of an odd-numbered channel, in terms of the relationship between the sign of a calculated value and the increase and decrease in driving current.

The MPU 532 stops the process from step S15 for a period of time T3 (several seconds) to wait until the laser oscillation of the wavelength-tunable laser 521 stabilizes (step S14). After the time T3, the MPU 532 judges whether it receives, from the system control circuit described above, a signal of finishing the operation of the wavelength stabilizing circuit (step S15). If there is a received signal of finishing the operation, the MPU 532 turns off the power supply, and ends the process (step S16).

On the other hand, if there is no received signal of finishing the operation, the MPU 532 returns the process to step S9, and repeats steps S9 to S15 until the calculated value falls within the permissible range. By repeating these steps, the oscillation wavelength of the wavelength-tunable laser 521 is locked at the predetermined wavelength of channel ch3. Furthermore, even if there is a shift in oscillation wavelength due to noise or the like, repeating these steps compensates for the shift, so that the oscillation wavelength is locked. Since this embodiment judges whether a channel corresponding to the predetermined wavelength is an even-numbered channel or odd-numbered channel, the wavelength capture range of each channel is two time the size of the channel wavelength intervals in DWDM optical communication.

Figure 26:
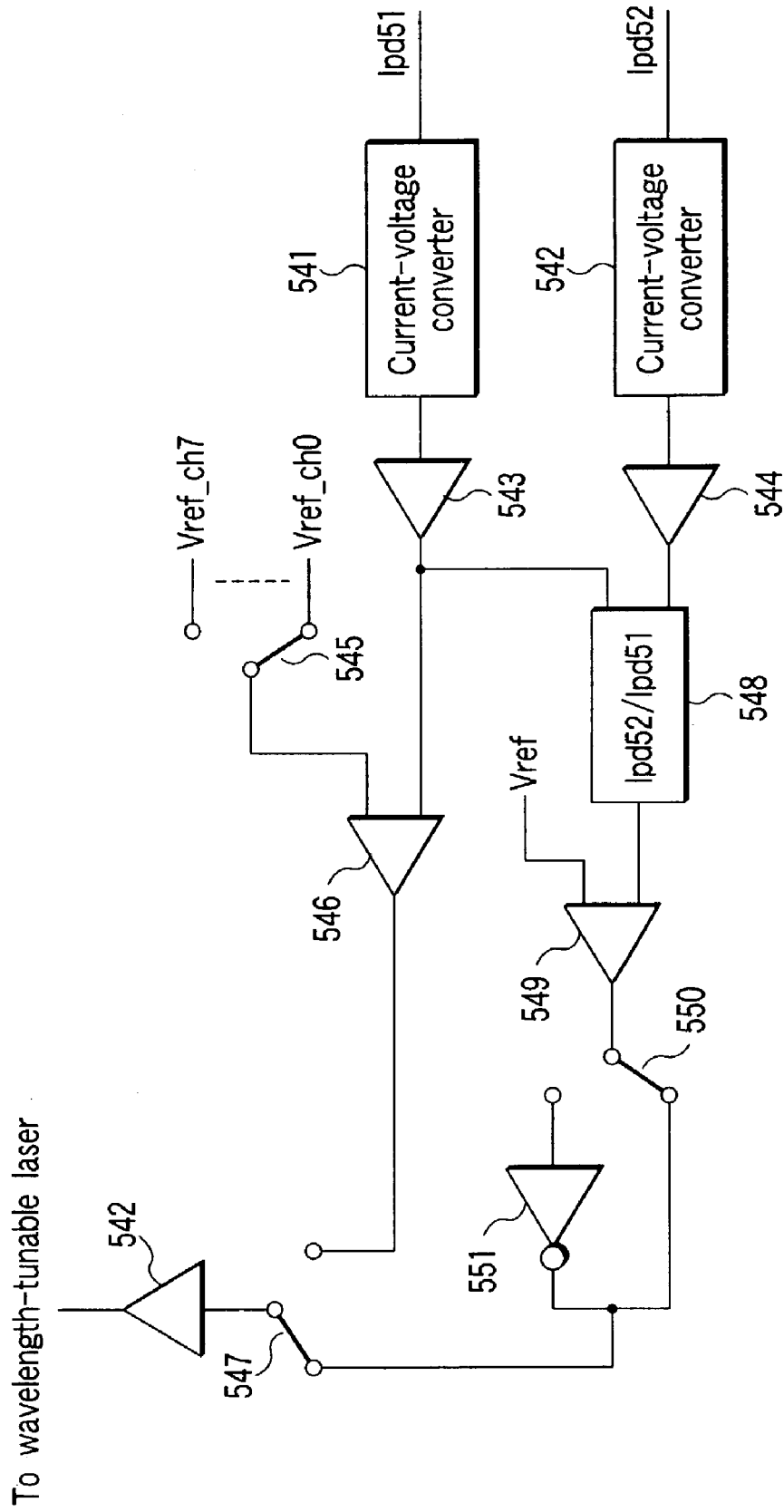
FIG. 26 is a view showing an arrangement example of an arithmetic circuit corresponding to the portion from the output of the first and second PDs to the output of an MPU in the fifteenth embodiment.

FIG. 26 is a view showing an arrangement example of an arithmetic circuit corresponding to the portion from the output of the first and second PDs 525 and 527 to the output of the MPU 532 in the laser transmitter device shown in FIG. 23.

In FIG. 26, the output currents Ipd51 and Ipd52 of the first PD 525 and second PD 527 are converted into voltages by current-voltage converters 541 and 542. The voltage outputted from the first current-voltage converter 541 is amplified by an amplifier 543 and is inputted into a comparator 546. The comparator 546 compares the input from the amplifier 543 with a reference voltage Vref_ch3 prepared in advance, and outputs a signal proportion to the difference. The Vref_ch3 is a voltage corresponding to the primary target value Y1. The output of the comparator 546 is connected to one (on the right side) of the terminals of a switch 547, which transmits a signal to the wavelength-tunable laser 521 through an amplifier 552. The switch 547 makes connection to said one (on the right side) of the terminals, when the difference between the output voltage of the amplifier 543 and the Vref_ch3 is large.

On the other hand, the voltage outputted from the second current-voltage converter 542 is amplified by an amplifier 544, and is inputted into a division circuit 548. The division circuit 548 calculates a normalized monitor output Ipd52/Ipd51 on the basis of the inputs from both the amplifiers 543 and 544. The output of the division circuit 548 is inputted into a comparator 549. The comparator 549 compares the input from the division circuit 548 with a reference voltage Vref, and outputs a signal proportion to the difference. The Vref is a voltage corresponding to the secondary target value X1. The output of the comparator 549 is connected to a switch 550. In accordance the signal from the system control circuit, the switch 550 makes connection to one (on the lower side) of the terminals for an even-numbered channel, and connection to the other (on the upper side) of the terminals for an odd-numbered channel.

Said one (on the lower side) of the terminals of the switch 550 is directly connected to the other (on the left side) of the terminals of the switch 547. The other (on the upper side) of the terminals of the switch 550 is connected to said other (on the left side) of the terminals of the switch 547 through an inverter 551, which inverts an input signal and then output it. The switch 547 makes connection to said other (on the left side) of the terminals, when the difference between the output voltage of the amplifier 543 and the Vref_ch3 described above is sufficiently small. The switch 547 transmits a signal to the wavelength-tunable laser 521 through the amplifier 552.

With this arrangement, the increase and decrease direction of the control signal is adjusted, so that the MPU 532 performs control, as explained with reference to the flowchart shown in FIG. 25.

In this embodiment, the first filter 523 is formed of a thin-film filter (band pass filter or the like), but is not limited to this. An FBG (Fiber Bragg Grating) filter or a periodic filter, such as an FP filter, may be used, as long as it is designed to have light transmissivity expressed by a characteristic line with a slant portion extending over the respective wavelengths of a plurality of channels in DWDM optical communication, such as channels ch0 to ch7. In the case of the periodic filter, it suffices that the respective wavelengths of channels ch0 to ch7 are disposed on a half of the FSR of the periodic filter.

(Sixteenth Embodiment)

Figure 27:
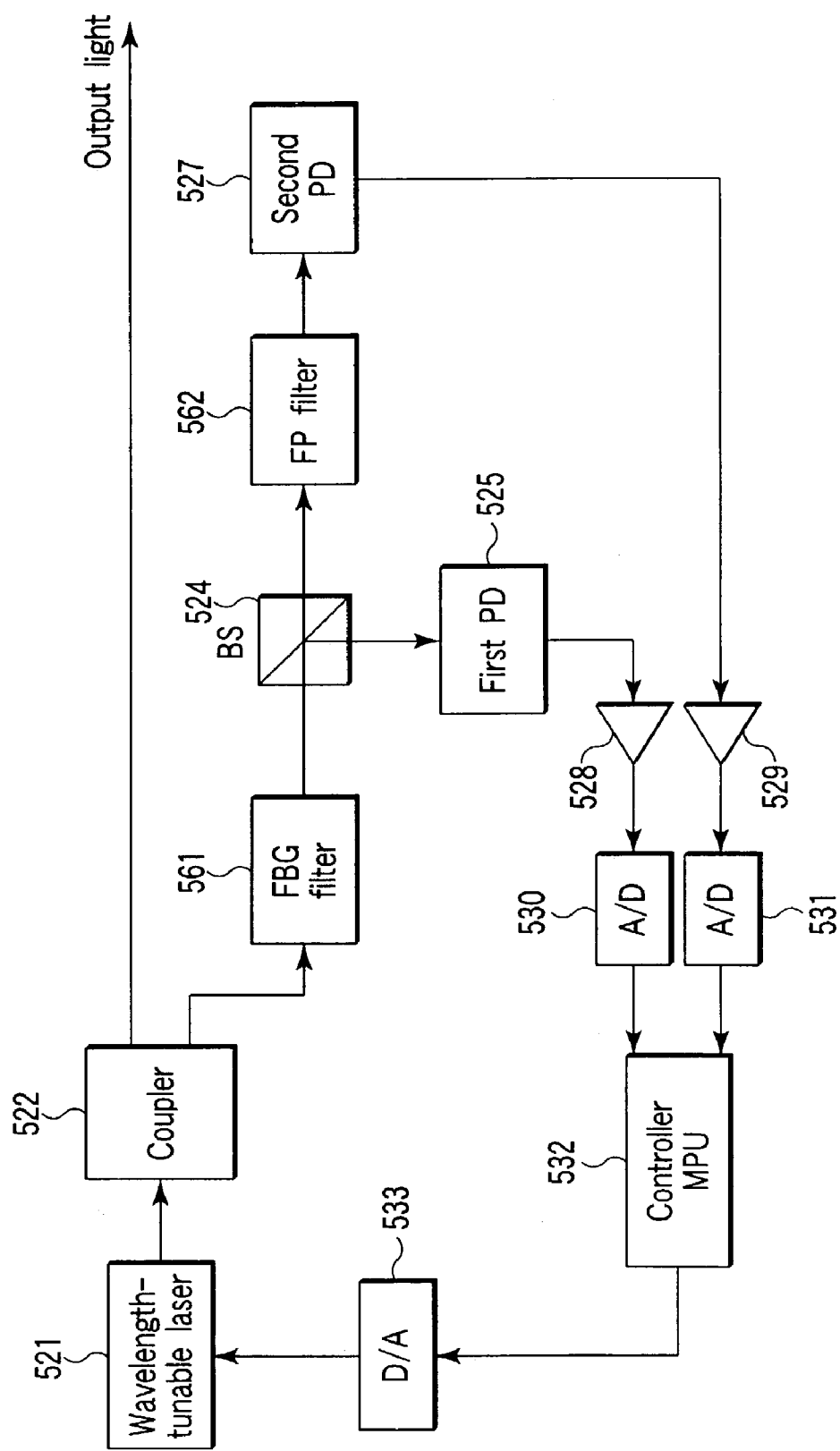
FIG. 27 is a block diagram showing a laser transmitter device according to a sixteenth embodiment of the present invention.

FIG. 27 is a block diagram showing a laser transmitter device according to a sixteenth embodiment of the present invention. This embodiment has an arrangement essentially the same as that of the fifteenth embodiment shown in FIG. 23, but differs from it in that an FBG filter 561 and FP filter 562 are used in place of the thin-film filter 523 and FP filter 526.

The FBG filter 561 is designed to have light transmissivity expressed by a characteristic line with a slant portion (a half of the FSR) extending over a plurality of channels in DWDM optical communication. More specifically, the FBG filter 561 has a characteristic such that the light transmissivity shows a monotone increase with the increase in wavelength (having no extreme value in the range) entirely over the wavelength range of channels ch0 to ch7 that a wavelength-tunable laser 521 is assigned to in DWDM optical communication. On the other hand, FP the filter 562 is designed to have an FSR equal to the channel intervals in DWDM optical communication. Specifically, the light transmissivity of the FP filter 562 changes in a cycle corresponding to the channel intervals. For example, where the wavelength intervals between the channels ch are 50 GHz based on an ITU-T recommendation, the FSR of the FP filter 562 is preset to be 50 GHz.

Figure 28:
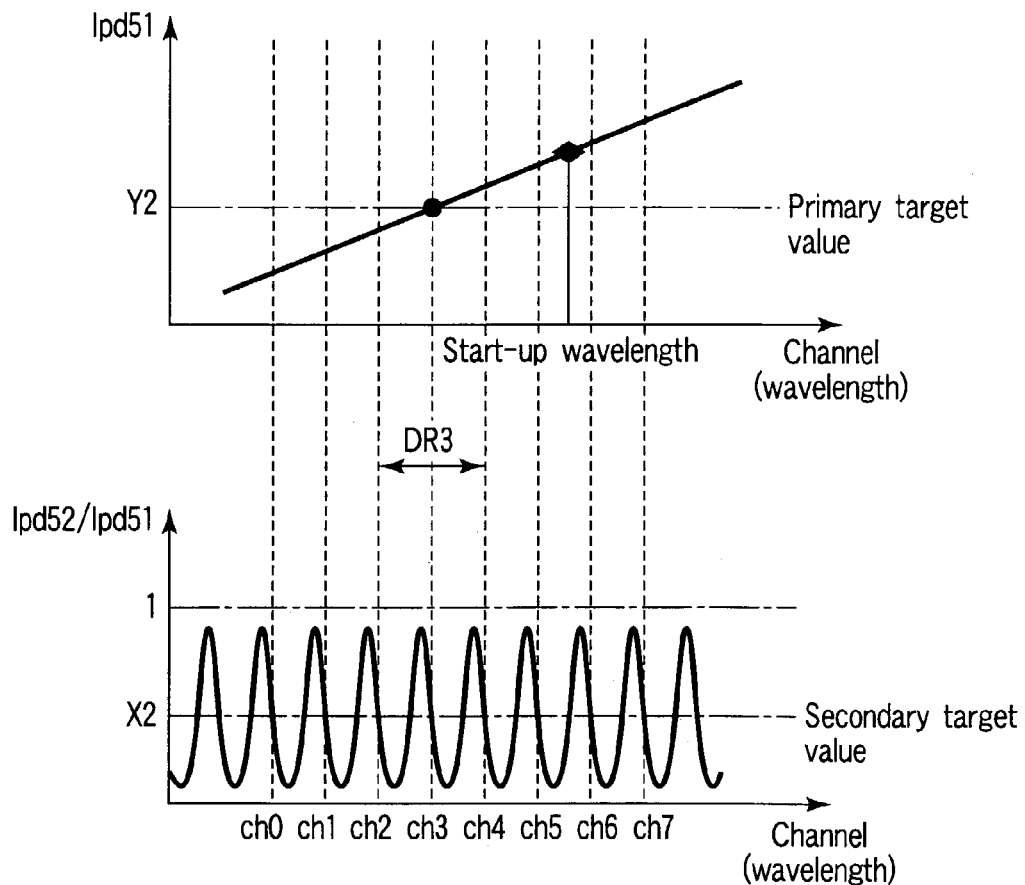
FIG. 28 is a graph showing the wavelength dependency of the output current of a first PD and a monitor output obtained by normalizing the output current of a second PD in the sixteenth embodiment.

FIG. 28 is a graph showing the wavelength dependency of the output current Ipd51 of a first PD 525 and a monitor output Ipd52/Ipd51 obtained by normalizing the output current Ipd52 of a second PD 527 with the Ipd51 the in the sixteenth embodiment. In FIG. 28, the horizontal axis denotes the DFB laser oscillation wavelength, and the vertical axis denotes the monitor output current or normalized monitor output. The output current Ipd51 from the first PD 525 shows wavelength dependency including a monotone increase over a plurality of channels, because it reflects the transmission characteristic of the filter 561.

On the other hand, the output current Ipd52 from the second PD 527 reflects both the transmission characteristics of the filters 561 and 562, because the second PD 527 receives light having passed through both the filters 561 and 562. As a consequence, the output current Ipd52 shows wavelength dependency such that it changes in the same cycle as the channel intervals while it increases along with the cyclic (periodic) change with the increase in wavelength. However, the Ipd52 is then normalized with the Ipd51 to calculate a value (Ipd52/Ipd51), thereby extracting a monitor output, which only shows the transmission characteristic of the FBG filter 561. In FIG. 28, a range DR3 denotes the wavelength capture range of channel ch3.

According to the sixteenth embodiment, since it is not necessary to distinguish control for the odd-numbered channel and that for even-numbered channel from each other, the arithmetic circuit can be simplified. An MPU 532 performs control such that steps S11 and S13 are excluded from the flowchart shown in FIG. 25.

(Seventeenth Embodiment)

Figure 29:
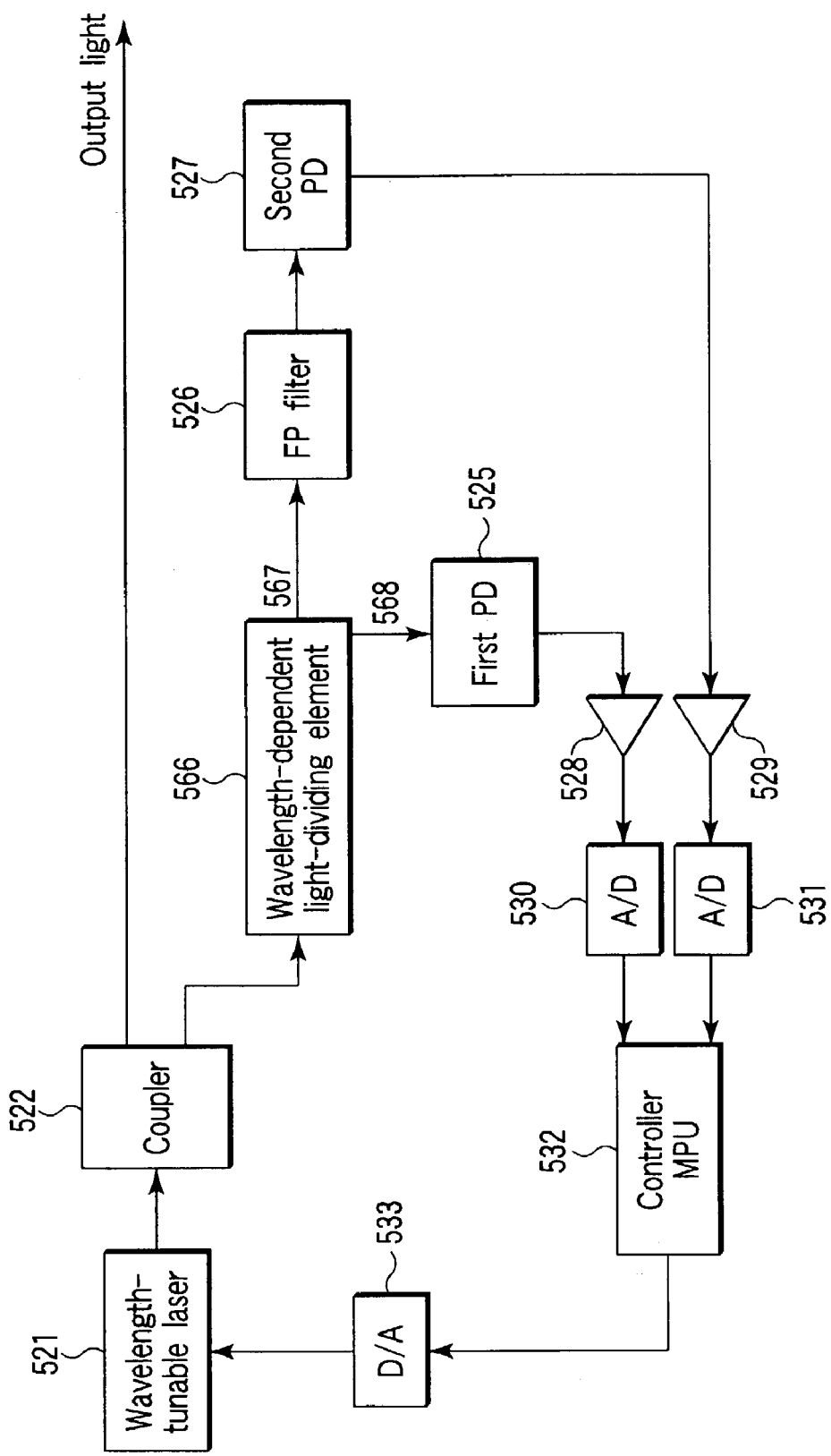
FIG. 29 is a block diagram showing a laser transmitter device according to a seventeenth embodiment of the present invention.

FIG. 29 is a block diagram showing a laser transmitter device according to a seventeenth embodiment of the present invention. This embodiment has an arrangement essentially the same as that of the fifteenth embodiment shown in FIG. 23, but differs from it in that a wavelength-dependent light-dividing element 566 is used in place of the thin-film filter 523 and FP filter 526. The light-dividing element 566 has output ports 567 and 568, one of which is an output port for transmitted light and the other is an output port for reflected light, for example.

Figure 30:
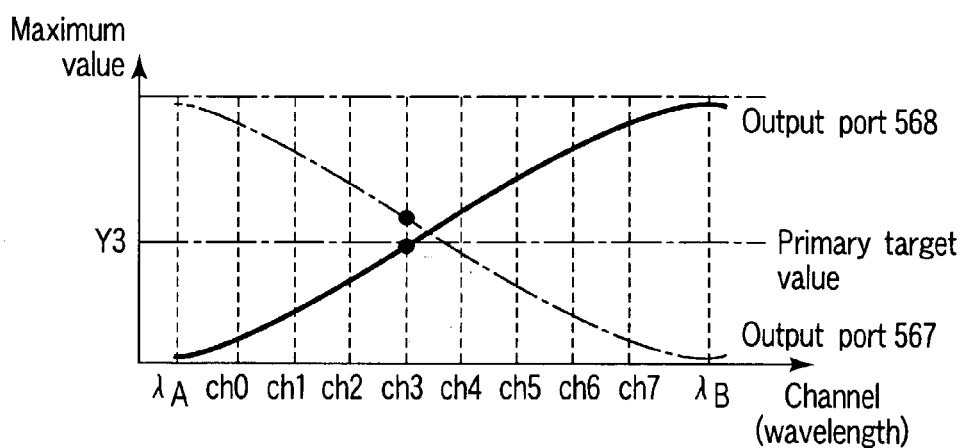
FIG. 30 is a graph showing the light-dividing characteristic of a wavelength-dependent light-dividing element relative to the oscillation wavelength in the seventeenth embodiment.

FIG. 30 is a graph showing the light-dividing characteristic of the wavelength-dependent light-dividing element 566 relative to the oscillation wavelength. Specifically, it has a characteristic for the output port 567 such that the light intensity shows a monotone decrease with the increase in wavelength (having no extreme value in the range) entirely over the wavelength range of channels ch0 to ch7 that a wavelength-tunable laser 521 is assigned to. When the oscillation wavelength is λA, almost all the light is outputted from the output port 567. On the other hand, it has a characteristic for the output port 568 such that the light intensity shows a monotone increase with the increase in wavelength (having no extreme value in the range) entirely over the wavelength range of channels ch0 to ch7 that the wavelength-tunable laser 521 is assigned to. When the oscillation wavelength is λB, almost all the light is outputted from the output port 568.

The light-dividing element 566 may be formed of an arrangement having a combination of a beam splitter with a light band pass filter. Instead, the light-dividing element 566 may be formed of an arrangement having a light circulator connected to a fiber grating, so that light passing through the light circulator is divided into reflected light and transmitted light by the fiber grating.

In FIG. 29, one of the light outputs divided by the wavelength-dependent light-dividing element 566 and coming from the output port 568 is incident on a first PD 525, which detects light intensity. The other of the light outputs coming from the output port 567 passes through an FP filter 526 and is incident on a second PD 527. The first and second PDs 525 and 527 output currents Ipd51 and Ipd52, respectively. Where the light-dividing element 566 has a characteristic shown in FIG. 30, the light intensity at each of the output ports 567 and 568 is determined by subtracting the other port light intensity from the total transmitted light intensity. Accordingly, an MPU 532 stores, in advance, a current Imax obtained when receiving all the light being transmitted, and calculates a normalized monitor output Ipd52/(Imax−Ipd51). As a consequence, the MPU 532 can perform the same control as in the fifteenth embodiment.

(Eighteenth Embodiment)

FIG. 31 is a block diagram showing a laser transmitter device according to an eighteenth embodiment of the present invention. This embodiment has an arrangement essentially the same as that of the seventeenth embodiment shown in FIG. 29, but differs from it in that a wavelength dividing-merging coupler (WDM coupler) 571 is used in place of the wavelength-dependent light-dividing element 566.

The WDM coupler 571 is a light-dividing element, which has a wavelength-dependent light-dividing characteristic shown in FIG. 30. The WDM coupler 571 may be fabricated by fusion-bonding parts of optical fibers. Instead, the WDM coupler 571 may be realized by a Mach-Zehnder interferometer formed of a planar light waive circuit based on quartz.

In FIG. 31, one of the light outputs divided by the WDM coupler 571 and coming from an output port 568 is incident on a first PD 525, which detects light intensity. The other of the light outputs coming from an output port 567 passes through an FP filter 526 and is incident on a second PD 527. The MPU 532 performs the same control as in the seventeenth embodiment.

According to the eighteenth embodiment, since the WDM coupler 571 is used, the number of assembling parts decreases, as compared to a wavelength-dependent light-dividing element that has a beam splitter combined with a light band pass filter, or a light circulator combined with a fiber grating.

(Matters Common to Fourteenth to Eighteenth Embodiments)

In the fourteenth to eighteenth embodiments, even where some filter is replaced with a reflector, and the reflector is combined with a filter, the above-described control can be performed. In this case, for example, a reflector 213 having a characteristic as explained in the sixth embodiment is used in place of the filter 523. Furthermore, even where an InGaAsP monitor PD 313 having a characteristic as explained in the tenth embodiment is used in place of a filter or reflector, the above-described control can be performed. In each of the embodiments, the laser transmitter device may be formed of a module of the so-called discrete type, which has no MPU 532 built therein, or may be formed of a module of the so-called complete type, which has an MPU 532 built therein.

(Matters Common to First to Eighteenth Embodiments)

According to the first to eighteenth embodiments of the present invention, it is possible to provide a laser transmitter device, which can reliably tune the oscillation wavelength of a laser light source for optical communication to a predetermined wavelength.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A laser transmitter device for dense wavelength-division multiplexing optical communication, comprising:
   a laser light source, whose oscillation wavelength is tunable;
   a first optical element having a first optical characteristic with wavelength dependency, whose light transmissivity or reflectivity shows a monotone increase or monotone decrease within a wavelength range over a plurality of channels in the optical communication;
   a second optical element and having a second optical characteristic with wavelength dependency, whose transmissivity or reflectivity changes in a cycle corresponding to intervals of the channels or two times the intervals;
   a first detection element configured to detect an intensity of light emitted from the laser light source and coming via the first optical element, and generate a first electric signal reflecting the first optical characteristic;
   a second detection element configured to detect an intensity of light emitted from the laser light source and coming via the second optical element, and generate a second electric signal reflecting the second optical characteristic; and
   a controller configured to tune the oscillation wavelength of the laser light source to a wavelength of a predetermined channel selected from the channels,
   wherein the first detection element is disposed to detect an intensity of light emitted from the laser light source and coming via the first optical element and not via the second optical element, and the second detection element is disposed to detect an intensity of light emitted from the laser light source and coming via the first and second optical elements,
   the controller receives the first and second electric signals, and performs a first stage adjustment of adjusting the oscillation wavelength of the laser light source into a wavelength capture range of the predetermined channel, based on a signal reflecting the first optical characteristic, and then a second stage adjustment of fine-tuning the oscillation wavelength of the laser light source to the wavelength of the predetermined channel, based on a signal reflecting the second optical characteristic, and
   the controller performs the first stage adjustment based on the first electric signal, and the second stage adjustment based on an output obtained by subjecting the second electric signal to a division process by the first electric signal.

2. The device according to claim 1, further comprising a third detection element configured to detect an intensity of light emitted from the laser light source and coming not via an optical element having an optical characteristic with wavelength dependency, and generate a third electric signal.

3. The device according to claim 1, wherein the first optical element is a filter, a half of whose free spectral range is larger than a wavelength range that the laser light source is assigned to in the optical communication.

4. The device according to claim 1, wherein the first optical element is a wavelength-dependent light-dividing element configured to divide light emitted from the laser light source into transmitted light and reflected light.

5. The device according to claim 1, wherein the second optical element is a filter, whose free spectral range is equal to intervals of the channels.

6. The device according to claim 1, wherein the second optical element is a filter, whose free spectral range is equal to two times intervals of the channels, and which has finesse in that a relationship between wavelength and light transmissivity agrees with the channels.

7. The device according to claim 1, wherein each of the first and second optical elements comprises a filter or reflector.

8. The device according to claim 1, wherein the first optical element comprises a low pass filter or band pass filter.

9. The device according to claim 4, wherein the wavelength-dependent light-dividing element comprises a beam splitter combined with a light band pass filter.

10. The device according to claim 4, wherein the wavelength-dependent light-dividing element comprises a light circulator combined with a fiber grating.

11. The device according to claim 4, wherein the wavelength-dependent light-dividing element comprises a wavelength dividing-merging coupler.

12. The device according to claim 1, wherein the laser light source, the first and second optical elements, and the first and second detection elements are disposed in a single module.

13. The device according to claim 1, wherein:
each of the first and second optical elements comprises afilter or reflector; and
the laser light source, the first and second optical elements, and the first and second detection elements are disposed in a single module.

* * * * *